(12) United States Patent
Fang et al.

(10) Patent No.: US 12,166,467 B2
(45) Date of Patent: Dec. 10, 2024

(54) SILVER-BONDED QUARTZ CRYSTAL

(71) Applicant: Statek Corporation, Orange, CA (US)

(72) Inventors: Yue Fang, Brea, CA (US); Thomas Pham, Tustin, CA (US)

(73) Assignee: Statek Corporation, Orange, CA (US)

( * ) Notice: Subject to any disclaimer, the term of this patent is extended or adjusted under 35 U.S.C. 154(b) by 725 days.

(21) Appl. No.: 17/305,897

(22) Filed: Jul. 16, 2021

(65) Prior Publication Data

US 2022/0077843 A1    Mar. 10, 2022

Related U.S. Application Data

(63) Continuation of application No. 15/937,065, filed on Mar. 27, 2018, now Pat. No. 11,070,190.

(51) Int. Cl.
*H03H 9/10* (2006.01)
*C08G 65/336* (2006.01)
(Continued)

(52) U.S. Cl.
CPC ......... *H03H 9/1021* (2013.01); *C08G 65/336* (2013.01); *H03H 3/04* (2013.01);
(Continued)

(58) Field of Classification Search
CPC ........ H03H 9/1021; H03H 9/19; H03H 9/215; H03H 9/0519; H03H 3/04;
(Continued)

(56) References Cited

U.S. PATENT DOCUMENTS 4,808,223 A   2/1989  Ozaki et al.
6,972,511 B2  12/2005 Akane et al.
(Continued)

FOREIGN PATENT DOCUMENTS

CN   1384703 A  * 12/2002  .......... C03C 17/006
CN   101594120 B    7/2012
(Continued)

OTHER PUBLICATIONS

Alarifi, et al., "Silver Nanoparticle Paste for Low-Temperature Bonding of Copper," Journal of Electronic Materials, vol. 40, No. 6, 2011, pp. 1394-1402, in 9 pages.
(Continued)

*Primary Examiner* — Jeffrey T Carley
(74) *Attorney, Agent, or Firm* — Knobbe, Martens, Olson & Bear, LLP

(57) ABSTRACT

The disclosed technology generally relates to packaging a quartz crystal, and more particularly to bonding a quartz crystal using sintering silver paste. In one aspect, a method of packaging a quartz crystal comprises attaching a quartz crystal to a package substrate using one or more silver paste layers comprising silver particles. The method additionally comprises sintering the silver paste in a substantially oxygen-free atmosphere and at a sintering temperature sufficient to cause sintering of the silver particles. The sintering is such that the quartz crystal exhibits a positive drift in resonance frequency of the quartz crystal over time. The method further comprises hermetically sealing the quartz crystal in the package substrate.

20 Claims, 20 Drawing Sheets

(51) Int. Cl.
*H03H 3/04* (2006.01)
*H03H 9/19* (2006.01)
*H03H 9/215* (2006.01)
*B22F 1/107* (2022.01)
*B22F 3/10* (2006.01)
*B29K 83/00* (2006.01)
*H03H 3/02* (2006.01)

(52) U.S. Cl.
CPC .............. *H03H 9/19* (2013.01); *H03H 9/215* (2013.01); *B22F 1/107* (2022.01); *B22F 2003/1042* (2013.01); *B29K 2083/00* (2013.01); *H03H 2003/026* (2013.01); *H03H 2003/0414* (2013.01)

(58) Field of Classification Search
CPC . H03H 2003/026; C08G 65/336; B22F 1/107; B22F 2003/1042; B22F 2998/10; B22F 7/08; B22F 7/064; B22F 3/10; B22F 2999/00; B29K 2083/00; C22C 1/0466
See application file for complete search history.

(56) References Cited

U.S. PATENT DOCUMENTS

| | | | | |
|---|---|---|---|---|
| 8,291,559 | B2* | 10/2012 | Heinze | H03H 3/04 29/25.35 |
| 8,505,804 | B2 | 8/2013 | Ogashiwa et al. | |
| 9,370,106 | B2* | 6/2016 | Kamakura | H05K 1/183 |
| 2005/0189848 | A1* | 9/2005 | Byers | H05K 13/04 310/348 |
| 2013/0049542 | A1* | 2/2013 | Otsuki | H01L 24/97 29/25.35 |
| 2013/0264109 | A1* | 10/2013 | Kamakura | H05K 1/181 29/832 |
| 2018/0222748 | A1* | 8/2018 | Hamelin | B81C 1/0065 |
| 2019/0177229 | A1 | 6/2019 | Ikoma et al. | |
| 2020/0028482 | A1* | 1/2020 | Hou | H03H 9/0504 |
| 2020/0274518 | A1 | 8/2020 | Yu et al. | |
| 2020/0358445 | A1* | 11/2020 | Northcutt | H03H 9/13 |

FOREIGN PATENT DOCUMENTS

| | | | | |
|---|---|---|---|---|
| CN | 102708943 A | 10/2012 | | |
| CN | 102290117 B | 3/2013 | | |
| CN | 104934100 A | 9/2015 | | |
| CN | 205750697 U | 11/2016 | | |
| CN | 106373634 A | 2/2017 | | |
| EP | 0 430 825 A1 | 6/1991 | | |
| EP | 3141322 A1 * | 3/2017 | ................ | B22F 1/00 |
| JP | 2014107512 A * | 6/2014 | | |
| JP | 59-40782 B2 | 6/2016 | | |
| JP | 2016-197723 A | 11/2016 | | |
| TW | 201622344 A | 6/2016 | | |
| WO | WO-2015034078 A1 * | 3/2015 | ......... | H01L 21/4846 |
| WO | WO 2017/036760 A1 | 3/2017 | | |

OTHER PUBLICATIONS

Amicon® C 990 Series; One Component, Silver-Filled, Microelectronic Grade Epoxy Adhesive, Emerson & Cuming—Technical Data, 1998, in 3 pages.

Bai, G., "Low-Temperature Sintering of Nanoscale Silver Paste for Semiconductor Device Interconnection," Center for Power Electronics Systems & Center for Microelectronics, Optoelectronics, and Nanotechnology & Department of Materials Science and Engineering Virginia Polytechnic Institute and State University, Oct. 2005, in 215 pages.

Die Attach Pastes for Electronic Devices, Kyocera Corporation, in 6 pages.

Dybwad, G. L., "Aging Analysis of Quartz Crystal Units With Ti Pd Au Electrodes," Bell Telephone Laboratories, Incorporation, Allentown, Pennsylvania, pp. 144-146B,Jun. 3, 1977.

England, et al., "Silver Sintering for Power Electronics," MEPTEC, Henkel, Oct. 23, 2014, in 21 pages.

Epo-Tek® P1011, Technical Data Sheet For Reference Only, Electrically Conductive Modified Polyimide, Epoxy Technology, Inc., Sep. 2017, in 2 pages.

Epoxiohm EO-98HT Electrically Conductive Epoxy Adhesive, EpoxySet Inc., Technical Bulletin, in 1 page, Mar. 23, 2014.

Masson, et al., "Die Attach Using Silver Sintering," European Journal of Electrical Engineering, vol. 16, No. 3-4 (2013), pp. 293-305.

"Silver Sintering Paste for High Power Die Attach," Developmental Product Data Sheet, Indium Corporation, in 6 pages.

Sintering Paste XT2773R6, Technical Information, Technical Report K-1-11486, Kyocera Chemical Corporation, Chemical Materials Engineering Division, 2014, in 8 pages.

Silver Sintering Paste, Kyocera, Semiconductor, Electronic Components Assembly Material, in 5 pages, downloaded on Dec. 18, 2017 at: <https://global.kyocera.com/prdct/chem/list/scmt/paste/sinering_paste/>.

Sylgard® 170 Fast Cure Silicone Elastomer, Product Information, Electronics, Dow Corning, Jul. 22, 2015, in 4 pages.

Zhang, et al., "Pressure-Assisted Low-Temperature Sintering of Silver Paste as an Alternative Die-Attach Solution to Solder Reflow," Center for Power Electronics Systems, The Bradley Department of Electrical and Computer Engineering and Department of Material Science and Engineering, Virginia Polytechnic Institute and State University, in 5 pages, 2002.

Zhang, et al., "Thermal Properties of Silver Nanoparticle Sintering Bonding Paste for High-Power LED Packaging," Journal of Nanomaterials, Hindawi Publishing Corporation 2016, vol. 2016, Article ID 8681513, 7 pages.

* cited by examiner

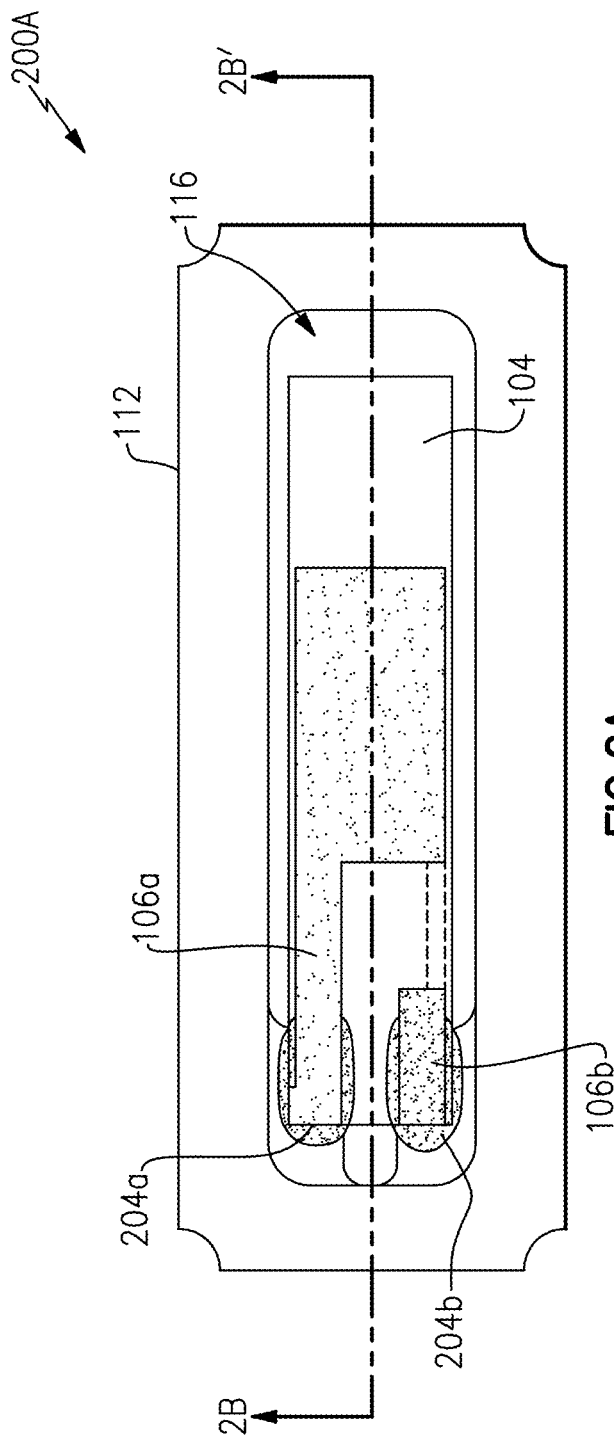
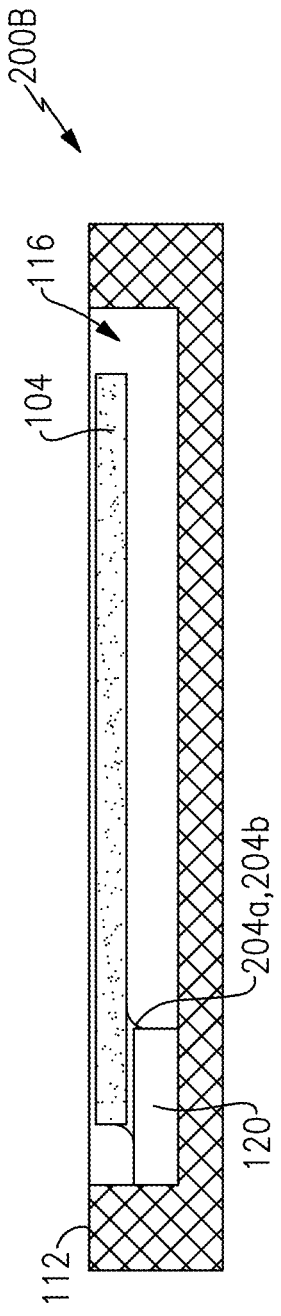
FIG.2A
FIG.2B

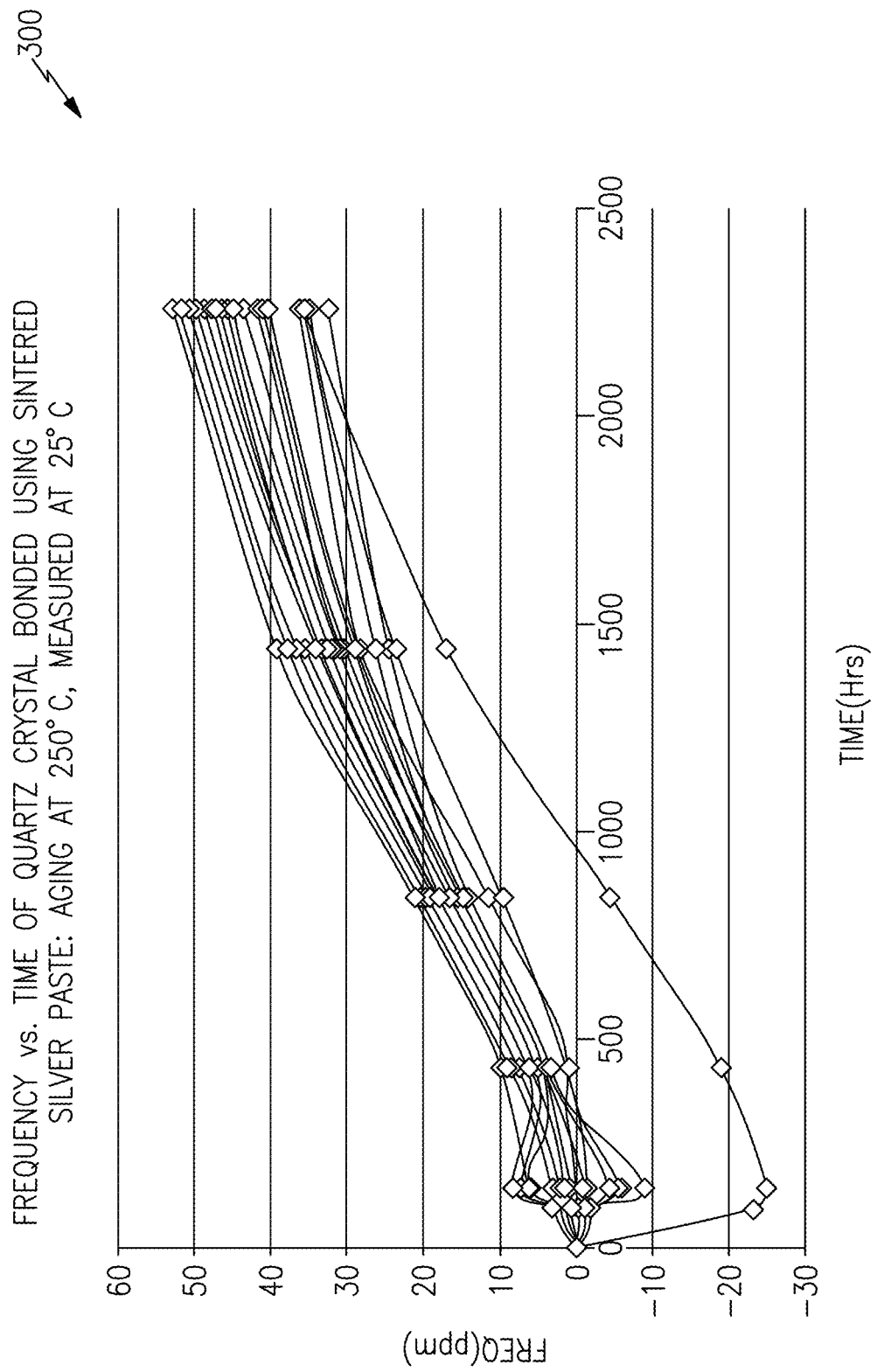

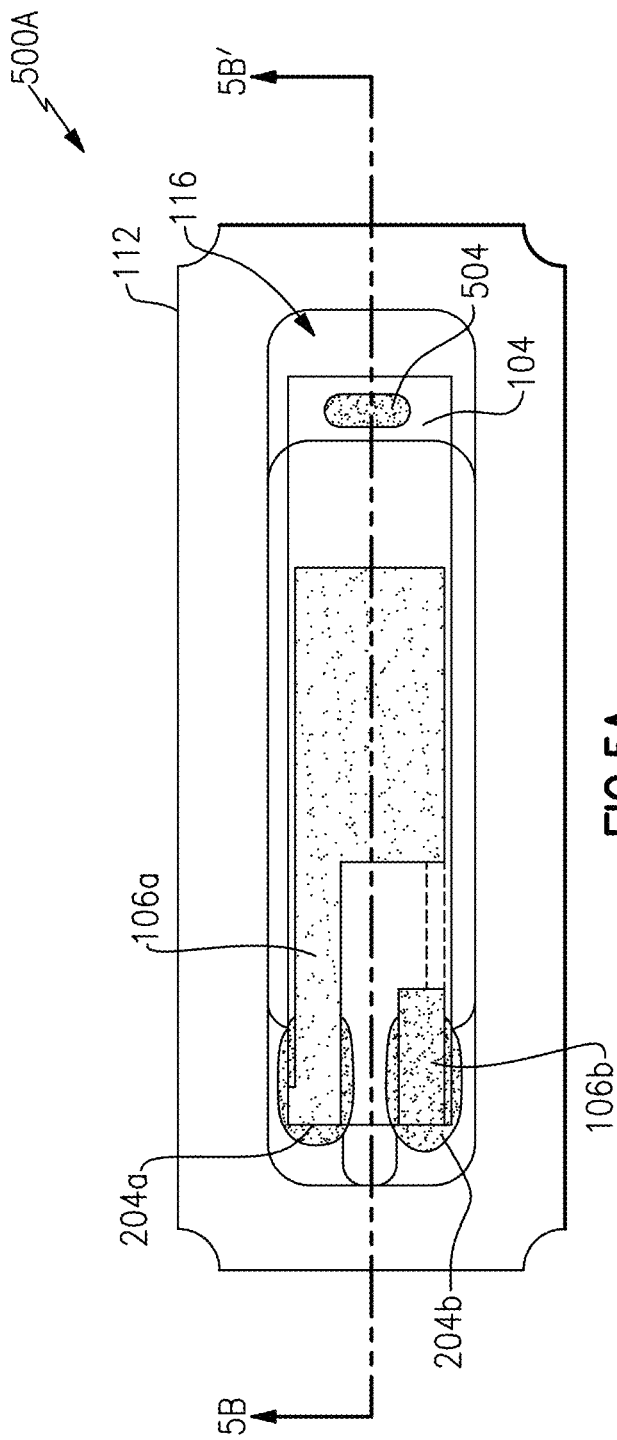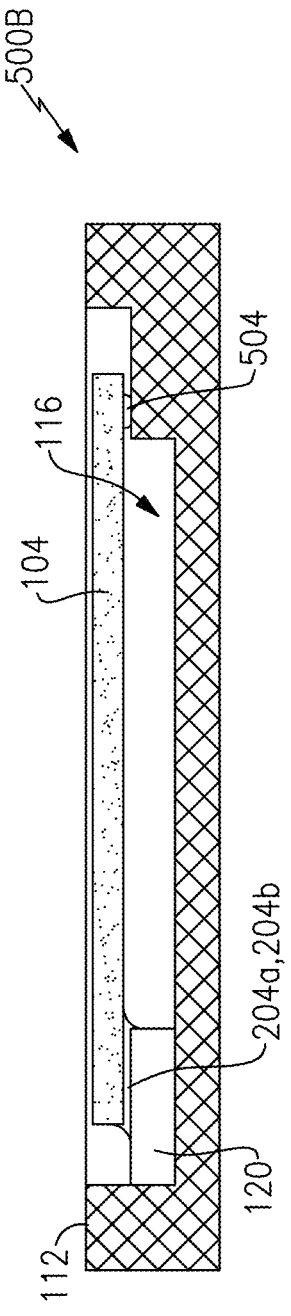
FIG.5A
FIG.5B

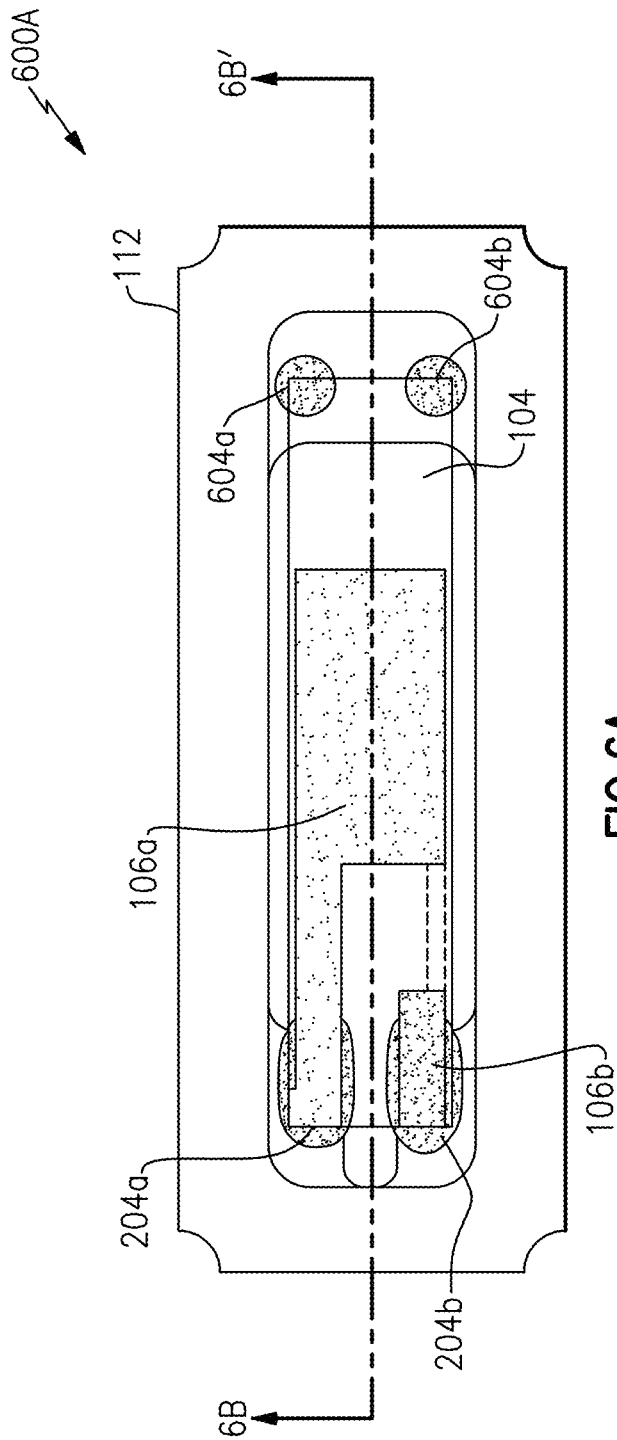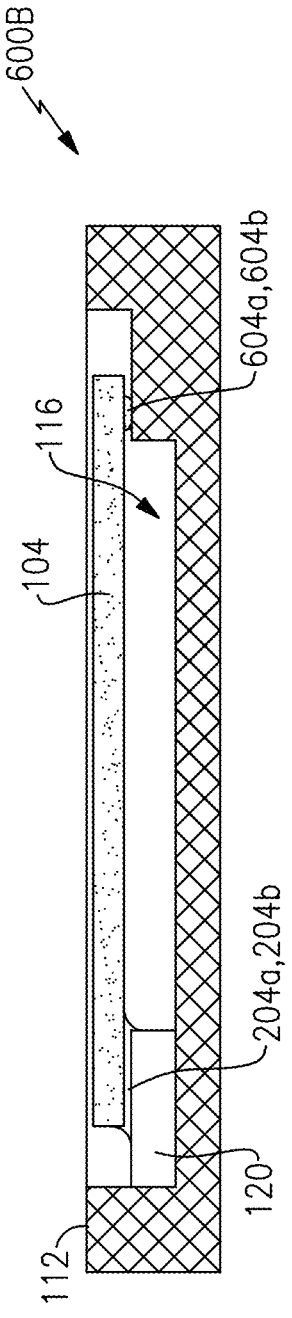

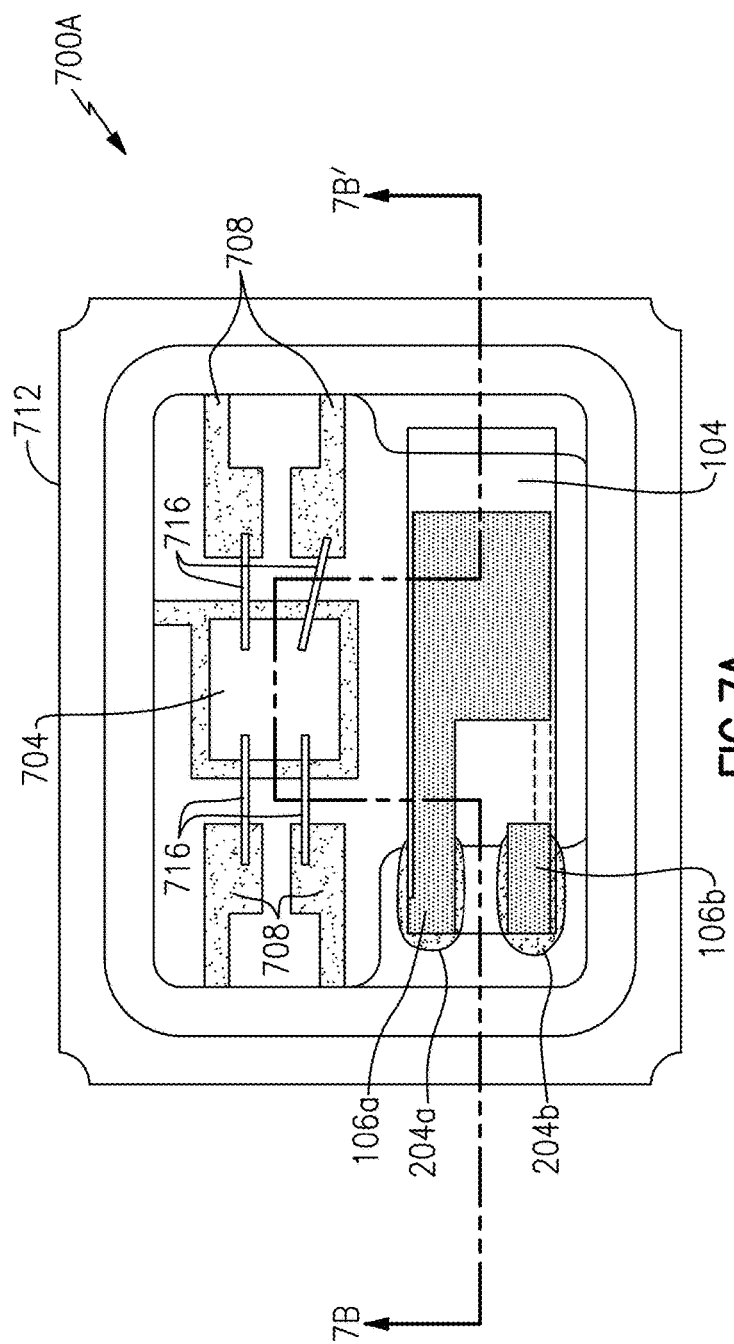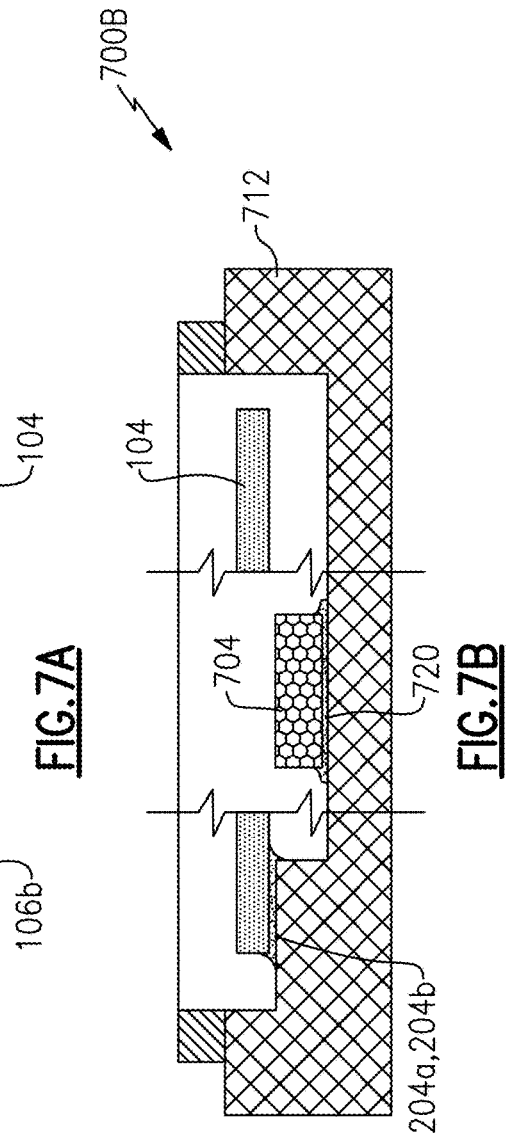
FIG.7A
FIG.7B

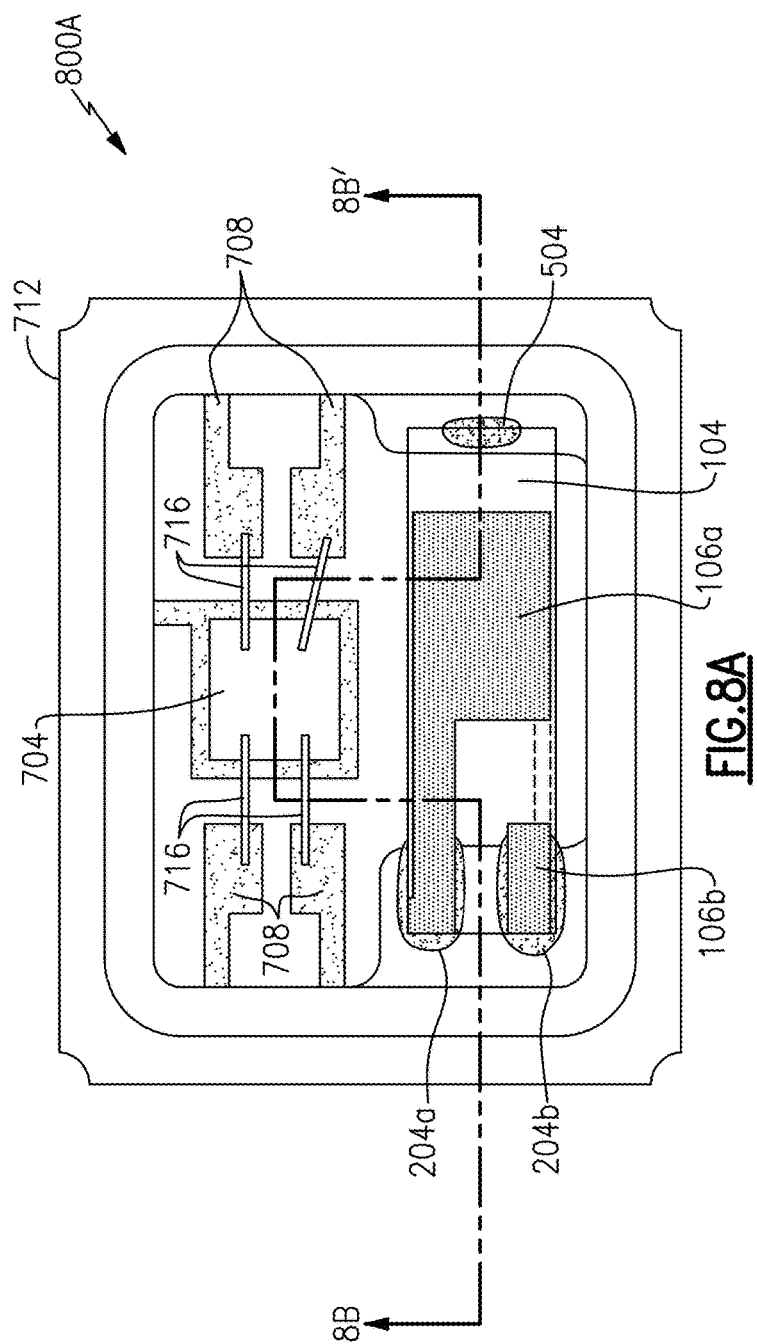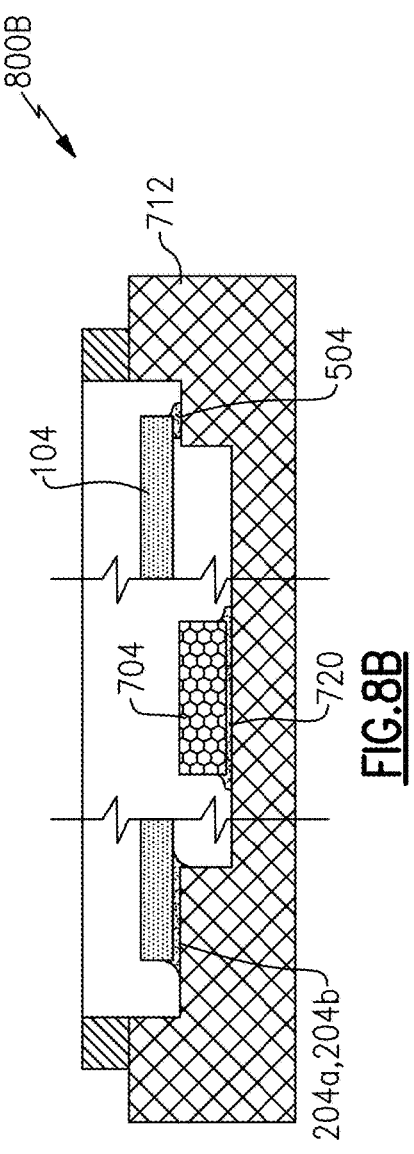
FIG.8A
FIG.8B

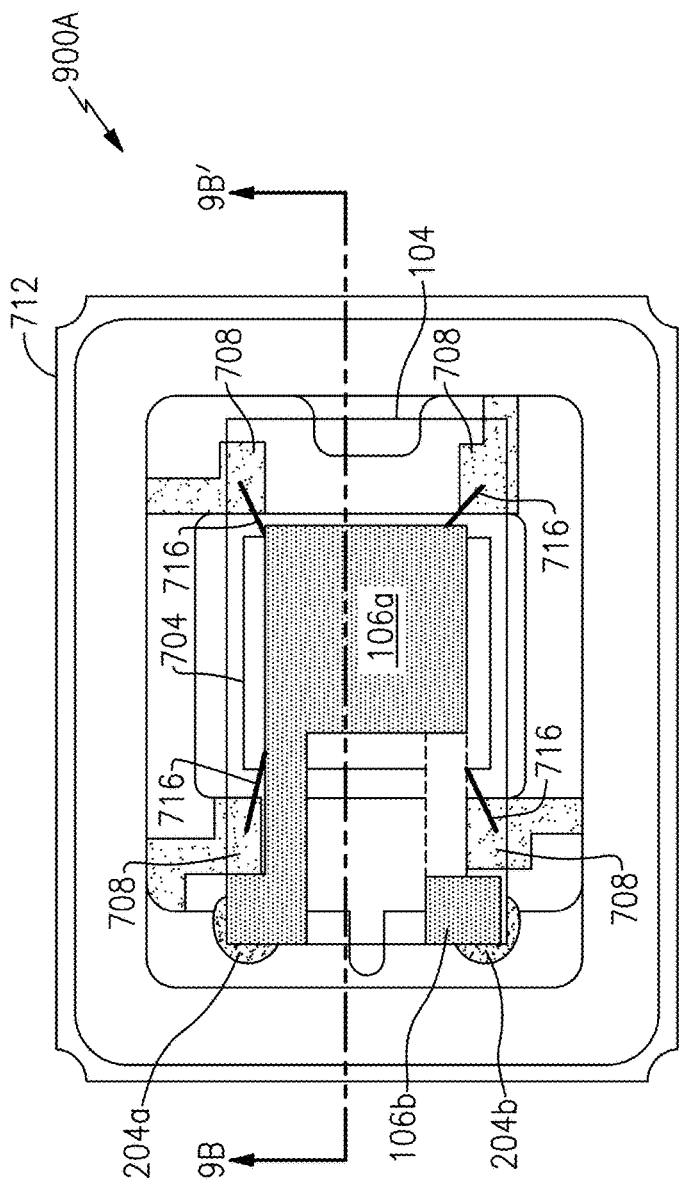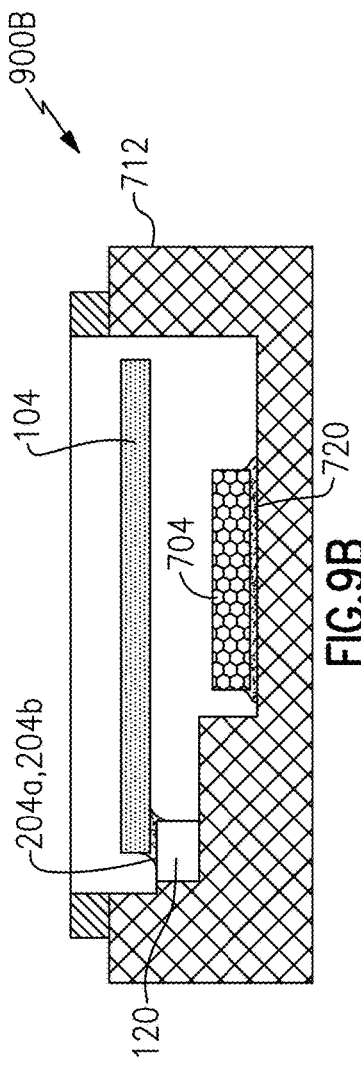

SILVER-BONDED QUARTZ CRYSTAL

INCORPORATION BY REFERENCE TO ANY PRIORITY APPLICATIONS

Any and all applications for which a priority claim is identified in the Application Data Sheet as filed with the present application are hereby incorporated by reference under 37 CFR 1.57.

This application is a continuation of U.S. patent application Ser. No. 15/937,065, filed Mar. 27, 2018, and entitled "SILVER-BONDED QUARTZ CRYSTAL," the content of which is hereby expressly incorporated by reference in its entirety.

BACKGROUND

Field of the Invention

The disclosed technology generally relates to electronic devices comprising a quartz crystal, and more particularly to a quartz crystal bonded to a substrate by a silver-containing bonding layer.

Description of the Related Art

A crystal oscillator is an electronic oscillator circuit that uses the mechanical resonance of a vibrating crystal of piezoelectric material to create an electrical signal with a precise frequency. This frequency can provide a stable reference signal, e.g., a clock signal, for digital integrated circuits, and to stabilize frequencies for radio transmitters and receivers. One type of piezoelectric resonator used is quartz crystal, and oscillator circuits using the quartz crystal are referred to as crystal oscillators.

A crystal oscillator, e.g., a quartz crystal oscillator, vibrates at a stable frequency by being distorted by an electric field when voltage is applied to an electrode near or on the crystal. This property is known as electrostriction or inverse piezoelectricity. When the field is removed, the quartz, which oscillates in a precise frequency, generates an electric field as it returns to its previous shape, and this can generate a voltage. This characteristic of a quartz crystal can be modeled as an RLC circuit. Advantages of quartz crystal oscillators include frequency accuracy, stability, and low power consumption. Because of these advantages, quartz crystal oscillators are used in many consumer devices such as wristwatches, clocks, radios, computers and cellphones, to name a few. Quartz crystals are also found inside test and measurement equipment, such as counters, signal generators, and oscilloscopes. However, high reliability is needed to fully benefit from the advantages of the quartz crystal oscillators.

Achieving high reliability can be especially challenging for specialized applications, e.g., high temperature, high reliability and high shock and vibration applications. Such applications include oil drilling, geothermal, commercial space, aircraft engine, aerospace, military and industrial instrumentation, to name a few. Some of the reliability degradations in these and other applications can be attributed to bonding layers used to bond the quartz crystal and/or the associated integrated circuit (IC) die in a ceramic die. Such degradations include drifting resonance frequency over time and degradation of mechanical function of the bonding layers. Thus, there is a need for reduction in reliability degradation in crystal oscillators.

SUMMARY

In one aspect, a method of packaging a quartz crystal comprises attaching a quartz crystal to a package substrate using one or more silver paste layers comprising silver particles. The method additionally comprises sintering the one or more silver paste layers in a substantially oxygen-free atmosphere and at a sintering temperature sufficient to cause sintering of the silver particles. The sintering is such that the quartz crystal exhibits a positive drift in resonance frequency of the quartz crystal over time. The method further comprises hermetically sealing the quartz crystal in the package substrate.

In some embodiments, attaching the quartz crystal further comprises further attaching the quartz crystal to the package substrate using one or more additional layers comprising one or more of an epoxy, a silicon-based elastomer and polyimide.

In some embodiments, the silver paste layers comprise silver particles at a concentration exceeding 85 weight %.

In some embodiments, the substantially oxygen-free atmosphere contains molecular oxygen at a concentration less than about 0.001%.

In some embodiments, the substantially oxygen-free atmosphere is a high vacuum atmosphere having a total pressure of about $1\times10^{-7}$ Torr to $1\times10^{-3}$ Torr.

In some embodiments, the sintering temperature sufficient to cause sintering is between about 225° C. and about 325° C.

In some embodiments, the method further comprises, prior to sintering, curing the silver paste at a curing temperature lower than the sintering temperature and between about 150° C. and about 250° C. in air.

In some embodiments, the silver paste comprises silver particles having a plurality of size or shape distributions.

In some embodiments, the silver paste comprises silver particles having a plate shape.

In some embodiments, n sintering transforms the silver paste into a percolated network of interconnected silver grains comprising greater than 90% by weight of silver.

In some embodiments, the quartz crystal is configured for operation at an operation temperature between about 200° C. and 300° C.

In some embodiments, the method further comprises pre-aging the electronic component prior to use at a temperature at or above the operation temperature for at least 24 hours.

In some embodiments, the quartz crystal comprises an electrode formed thereon, and the package substrate comprises a metallization layer formed thereon, wherein one or both of the electrode and the metallization layer comprises gold.

In some embodiments, the method further comprises attaching an integrated circuit die electrically connected to the quartz crystal to the package substrate by sintering a silver paste layer comprising silver particles.

In some embodiments, the silver paste layer for attaching the integrated circuit die and the one or more silver paste layers for attaching the quartz crystal are sintered simultaneously.

In some embodiments, the method further comprises attaching an integrated circuit die electrically connected to the quartz crystal to the package substrate by using an additional bonding layer, wherein the additional bonding layer comprises one or more of an epoxy, a silicon-based elastomer and a polyimide-based material.

In some embodiments, the package substrate comprises a ceramic package substrate.

In some embodiments, the package substrate comprises a metal package substrate.

In another aspect, a method of packaging a quartz crystal comprises forming a sintered silver paste bonding layer between a quartz crystal and a package substrate at a first location. The method additionally comprises forming a flexible bonding layer between the quartz crystal and the package substrate at a second location, where the flexible bonding layer comprises one or more of an epoxy, a silicon-based elastomer and a polyimide-based material. The silver paste bonding layer and the flexible bonding layer are configured to cause shifts in a resonance frequency of the quartz crystal in opposite frequency directions.

In some embodiments, the sintered silver paste bonding layer is configured to cause the resonance frequency of the quartz crystal to increase, whereas the additional bonding layer is configured to cause the resonance frequency of the quartz crystal to decrease.

In some embodiments, the sintered silver paste bonding layer and the additional bonding layer are formed on opposite edge regions of the quartz crystal.

In some embodiments, the method further comprises attaching an integrated circuit (IC) die electrically connected to the quartz crystal to the package substrate by sintering a silver paste layer comprising silver particles.

In some embodiments, the IC die is disposed laterally adjacent to the quartz crystal.

In some embodiments, the IC die is disposed in a cavity formed in the package substrate under the quartz crystal.

In some embodiments, forming the sintered silver paste bonding layer comprises sintering a silver paste comprising silver particles at a concentration exceeding 85 weight %.

In some embodiments, sintering the silver paste transforms the silver paste into the silver paste bonding layer comprising greater than 90% by weight of silver.

In some embodiments, forming the sintered silver paste bonding layer comprises sintering a silver paste in a substantially oxygen-free atmosphere containing molecular oxygen at a concentration less than about 0.001%.

In some embodiments, the method further comprises, prior to sintering, curing the silver paste at a curing temperature lower than the sintering temperature and between about 150° C. and about 250° C. in air.

In some embodiments, forming the sintered silver paste bonding layer comprises sintering at a temperature between about 225° C. and about 325° C.

In another aspect, a method of packaging a quartz crystal oscillator comprises forming a sintered silver paste bonding layer between a quartz crystal and a package substrate. The method additionally comprises forming an additional bonding layer between an integrated circuit (IC) die electrically connected to the quartz crystal and the package substrate, where the additional bonding layer comprises one or more of an epoxy, a silicon-based elastomer and a polyimide-based material. The silver paste bonding layer and the additional bonding layer are configured to cause shifts in a resonance frequency of the quartz crystal in opposite frequency directions.

In some embodiments, the silver paste bonding layer is configured to cause the resonance frequency of the quartz crystal to increase, whereas the additional bonding layer is configured to cause the resonance frequency of the quartz crystal to decrease.

In some embodiments, the IC die is disposed laterally adjacent to the quartz crystal.

In some embodiments, the IC die is disposed in a cavity formed in the package substrate under the quartz crystal.

In some embodiments, forming the sintered silver paste bonding layer comprises sintering a silver paste comprising silver particles at a concentration exceeding 85 weight %.

In some embodiments, sintering the silver paste transforms the silver paste into the silver paste bonding layer comprising greater than 90% by weight of silver.

In some embodiments, forming the sintered silver paste bonding layer comprises sintering a silver paste in a substantially oxygen-free atmosphere containing molecular oxygen at a concentration less than about 0.001%.

In some embodiments, the method further comprises, prior to sintering, curing the silver paste at a curing temperature lower than the sintering temperature and between about 150° C. and about 250° C. in air.

In some embodiments, forming the sintered silver paste bonding layer comprises sintering a temperature between about 225° C. and about 325° C.

In another aspect, quartz crystal device comprises a package substrate and a quartz crystal bonded to the package substrate by a plurality of bonding layers and hermetically sealed in the package substrate. At least one of the bonding layers comprises sintered silver paste, wherein the sintered paste comprises greater than 90% by weight of silver. In addition, at least one of the bonding layers comprises an additional bonding material comprising one or more of an epoxy, a silicon-based elastomer and a polyimide-based material.

In some embodiments, the at least one of the bonding layers comprising the sintered silver paste is configured to causes a positive drift in resonance frequency of the quartz crystal over time.

In some embodiments, the at least one of the bonding layers comprising the additional bonding material is configured to causes a negative drift in resonance frequency of the quartz crystal over time.

In some embodiments, the positive drift and the negative drift are such that a net drift in resonance frequency of the quartz crystal does not exceed +/−200 ppm after aging for 4000 hours at 250° C.

In some embodiments, the bonding layers have a combined bond strength such that the bonds do not fail in response to a shock pulse having a peak amplitude less than 20,000 g and a pulse width less than 0.1 ms.

In some embodiments, the at least another one of the bonding layers has a glass transition temperature less than 200° C.

In some embodiments, a ratio of Young's moduli of the sintered silver paste and the additional bonding material exceeds 2.

In some embodiments, a ratio of thermal conductivities of the sintered silver paste and the at least the another one of bonding layers exceeds 20.

In another aspect, a quartz crystal oscillator comprises a package substrate and a quartz crystal bonded to the package substrate by one or more sintered silver paste bonding layers and hermetically sealed in the package substrate. The one or more sintered silver paste bonding layers comprise greater than 90% by weight of silver. The quartz crystal oscillator additionally comprises an integrated circuit (IC) die electrically connected to the quartz crystal and bonded to the ceramic package substrate by an additional bonding layer, wherein the additional bonding layer comprises one or more of an epoxy, a silicon-based elastomer and a polyimide-based material.

In some embodiments, the at least one of the sintered silver paste bonding layers are configured to causes a positive drift in resonance frequency of the quartz crystal over time.

In some embodiments, the additional bonding layer is configured to causes a negative drift in resonance frequency of the quartz crystal over time.

In some embodiments, the positive drift and the negative drift is such that a net drift in resonance frequency of the quartz crystal does not exceed +/−200 ppm after aging for 4000 hours at 250° C.

In some embodiments, the additional bonding layer has a glass transition temperature less than 200° C.

In some embodiments, a ratio of Young's moduli of the sintered silver paste bonding layer and the additional bonding layer exceeds 2.

In some embodiments, a ratio of thermal conductivities of the sintered silver paste bonding layer and the additional bonding layer exceeds 20.

BRIEF DESCRIPTION OF THE DRAWINGS

FIG. 2A illustrates a plan-view of a quartz crystal disposed in a ceramic package substrate, according to some embodiments.

FIG. 2B illustrates a cross-sectional view of the quartz crystal in the ceramic package substrate as illustrated in FIG. 2A.

FIG. 3 illustrates an experimental graph of high temperature frequency drift of the packaged quartz crystal illustrated in FIG. 2C.

FIG. 5A illustrates a plan-view of a quartz crystal packaged in a ceramic package substrate, according to some embodiments.

FIG. 5B illustrates a cross-sectional view of the packaged quartz crystal illustrated in FIG. 5A.

FIG. 6A illustrates a plan-view of a quartz crystal packaged in a ceramic package substrate, according to some embodiments.

FIG. 6B illustrates a cross-sectional view of the packaged quartz crystal illustrated in FIG. 6A.

FIG. 7A illustrates a plan-view of a quartz crystal and an integrated circuit die packaged in a ceramic package substrate, according to some embodiments.

FIG. 7B illustrates a cross-sectional view of the quartz crystal and the integrated circuit die illustrated in FIG. 7A.

FIG. 8A illustrates a plan-view of a quartz crystal oscillator including a quartz crystal and an integrated circuit die packaged in a ceramic package substrate, according to some embodiments.

FIG. 8B illustrates a cross-sectional view of the quartz crystal oscillator illustrated in FIG. 8A.

FIG. 9A illustrates a plan-view of a quartz crystal and an integrated circuit die packaged in a ceramic package substrate, according to some embodiments.

FIG. 9B illustrates a cross-sectional view of the packaged quartz crystal and the integrated circuit die illustrated in FIG. 9A.

DETAILED DESCRIPTION

In the following, various embodiments of packaged quartz crystal and quartz crystal oscillator are described, having high reliability for various applications, including high temperature and high shock and/or vibration applications. Such applications include oil drilling, geothermal, commercial space, aircraft engine, aerospace, military and industrial instrumentation, to name a few. The various embodiments advantageously enable the high reliability by bonding the quartz crystal to a ceramic package substrate using a bonding layer comprising sintered silver paste. The bonding layer comprising the sintered silver paste is formed by attaching a quartz crystal to a ceramic package substrate using a silver paste layer comprising silver particles, and sintering the silver paste in a substantially oxygen-free atmosphere and at a sintering temperature sufficient to cause sintering of the silver particles. The sintering is such that the quartz crystal exhibits a positive drift in resonance frequency of the quartz crystal over time. Advantageously, when the quartz crystal is further bonded to the ceramic package substrate using an additional bonding layer, e.g., a bonding layer that may be more flexible than the bonding layer comprising sintered silver paste, which causes a negative drift in resonance frequency of the quartz crystal over time, the bonding layer comprising the sintered silver paste and the additional bonding layer cause shifts in a resonance frequency of the quartz crystal in opposite frequency directions, thereby resulting in a reduced or essentially eliminated drift in the resonance frequency.

Figure 1:
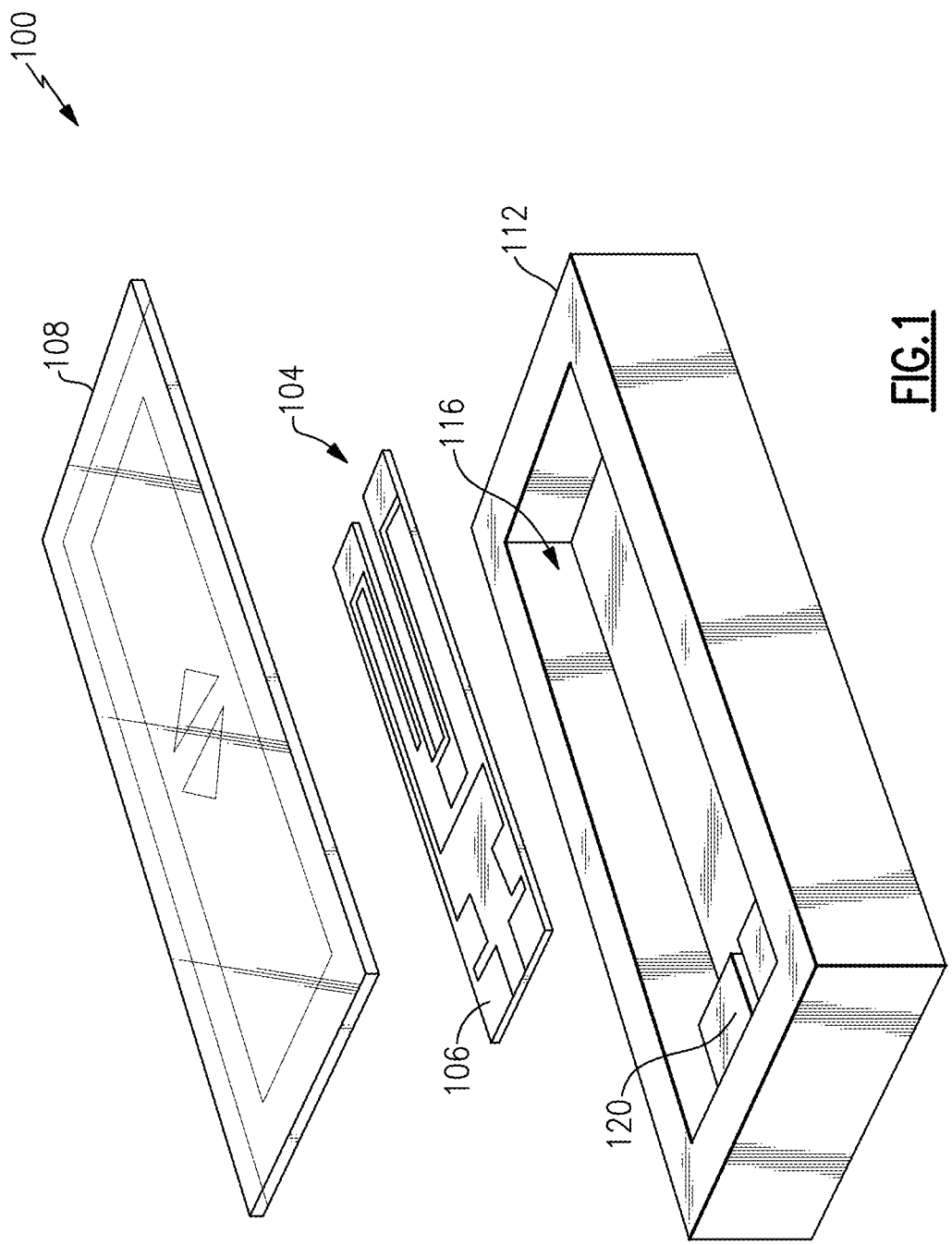
FIG. 1 illustrates a perspective view of components of a packaged quartz crystal, according to some embodiments.

FIG. 1 illustrates a perspective view of components 100 for packaging a quartz crystal 104, e.g., as part of a quartz crystal device, according to embodiments. The quartz crystal 104 may be, e.g., a tuning fork. The components 100 include a ceramic package substrate 112 and a lid 108 for housing a quartz crystal 104 having formed thereon a metallization pattern including electrodes.

The ceramic package 112 comprises a ceramic frame having a plurality walls that form a recess 116 configured to house the quartz crystal 104. The ceramic package 112 is configured to provide thermal and electrical communication between the quartz crystal 104 and the outside world, e.g., a PCB (not shown), through one or more metallization structures (not shown), which may include one or more inner metallization pads, one or more outer metallization pads, and one or more vias electrically connecting the one or more inner and outer metallization pads for providing the thermal and electrical communication. In some embodiments, the metallization structures comprise a layer stack including one or more of a nickel (Ni) layer, a palladium (Pd) layer and a gold (Au) layer, such that the quartz crystal 104 is configured to contact the outermost material of the layer stack, e.g., the Au layer. According to various embodiments, the Ni layer and the Pd layer are deposited by electroless-deposition and the Au layer may be formed by an immersion process. In some embodiments, the metallization structures consist of a nickel (Ni) layer and a gold (Au) layer or consist of a gold (Au) layer One or more mounting pedestals 120 may be formed inside the cavity 116 of the ceramic package 112 that are configured for mounting the quartz crystal 104. While not shown, the mounting pedestals 120 may have formed thereon an inner metallization pad that is electrically connected to an outer metallization pad for providing electrical and thermal communication between the quartz crystal 104 and the outside world.

The quartz crystal 104 includes quartz crystal that is cut according to one of various orientations, including, e.g., an AT cut or a SC cut. The quartz crystal 104 includes a metallization pattern 106 including, e.g., an electrode pattern, formed on one or both of major surfaces of the quartz crystal 104. The quartz crystal 104 according to various embodiments may be manufactured using a mechanical process, a lithographic process or a combination of mechanical and lithographic processes. In a mechanical process, a quartz blank is thinned by mechanical lapping and/or polishing according to a desired frequency. The thinned quartz blank is then shaped by cutting or dicing. In a lithographic process, the thinned quartz blank is shaped by lithography and etch. Thereafter, in some implementations, the metallization pattern 106 may be formed using a shadow mask process. In other implementations, the metallization pattern 106 may be formed by depositing a metal layer using a thin film deposition process on a quartz substrate that is milled and subsequently polished and/or chemically etched to have a predetermined frequency, followed by lithography and etch processes to form the metallization pattern 106. The metallization pattern 106 includes a circuit pattern, e.g., a pattern of electrodes, whose surface may comprise, e.g., gold, e.g., a stack including a chrome layer and a gold layer or a stack including a titanium layer and a gold layer. However, embodiments are not so limited, and the metallization pattern 106 can include other metals, e.g., Ag and Al. The quartz crystal 104 is thereafter can be further adjusted to have a more precisely desired frequency.

Thereafter, the quartz crystal 104 may be bonded to the ceramic package 112 using one or more bonding layers comprising a layer of sintered silver paste, according to various embodiments described herein. The silver paste layer has a composition and is sintered under an atmosphere and at a temperature such that the quartz crystal 104 exhibits a positive frequency drift over time.

In various embodiments described herein, the quartz crystal 104 has a length and a width suitable for providing a quartz crystal having a frequency between 0.00001 Hz and 250 MHz or between 0.001 Hz and 250 Hz, for instance about 0.1 Hz, for various applications described above.

Thereafter, the quartz crystal 104 may be hermetically sealed by bonding the lid 108 on rims of the ceramic package 112. The bonding of the quartz crystal 104 may be performed such that the metallization pattern 106 of the quartz crystal 104 is bonded, mechanically and/or electrically bonded, to a metallization structure of the ceramic package 112 described above. In some embodiments, both the metallization structure of the ceramic package 112 and the metallization pattern 106 comprise gold, such that a bonding layer formed therebetween contacts gold on both sides.

Quartz crystals and crystals oscillators can exhibit a gradual change of frequency with time, known as aging. The aging phenomenon can be caused by one or more mechanisms. For example, without being bound to any theory, aging can be caused by the mounting and contacts undergoing relief of built-in stresses after packaging. Additionally or alternatively, aging can be caused by contamination, which may originate from various sources such as gases of the residual atmosphere, the crystal, electrodes (e.g. gold, chromium or aluminum), bonding layers (e.g., polymeric materials) or other packaging materials, that can subsequently be adsorbed on the crystal surface, thereby changing its mass, or be absorbed by the crystal volume, thereby causing chemical reactions and changing the composition or altering the lattice structure of the quartz crystal. Aging can also be caused by various other factors, including chemical reactions on the inner surfaces of the enclosure and changes in pressure in the enclosure. Factors outside of the crystal itself may also cause aging. For example, aging may be caused by changes in the oscillator circuitry (e.g. change of capacitances). External atmosphere composition can also cause of contribute to aging, e.g., hydrogen diffusion. Without being bound to any theory of aging, the inventors have discovered that the bonding layer materials and the processing methods of bonding the quartz crystal 104 to the ceramic package 112 significantly contributes to the aging behavior of the quartz crystal 104. Based on this and other observation, by choosing particular materials, processing conditions and geometries of the bonding layers according to various embodiments described herein, the negative impact of frequency drift over time resulting from aging can be substantially reduced or even essentially eliminated.

In FIG. 1 and throughout the application, while the disclosed embodiments may include a ceramic package 112, embodiments are not so limited. In other embodiments, quartz crystals or quartz crystal oscillators may be packaged in a metallic package.

Figure 2C:
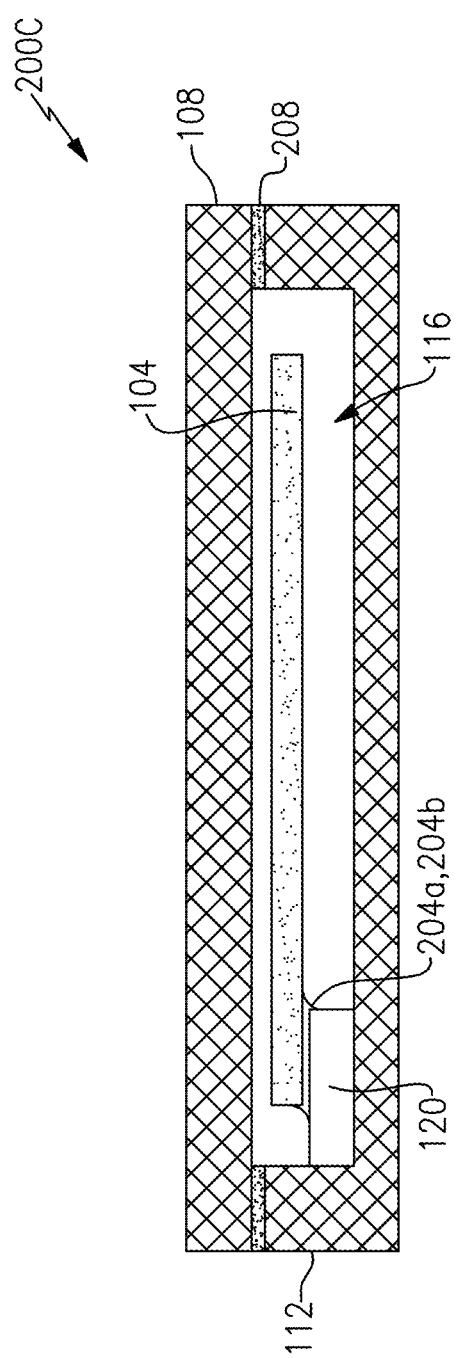
FIG. 2C illustrates a cross-sectional view of a quartz crystal hermetically sealed in the ceramic package illustrated in FIGS. 2A and 2B.

FIGS. 2A and 2B illustrate a plan-view 200A and a cross sectional view 200B, respectively, of a quartz crystal 104 disposed in a ceramic package substrate 112, according to some embodiments. FIG. 2C illustrates a cross-sectional view of the quartz crystal 104 hermetically sealed in the ceramic package 112 illustrated in FIGS. 2A and 2B. For illustrative purposes, the packaged quartz crystal 104 in FIGS. 2A and 2B are illustrated without the lid (108 in FIG. 1). The packaged quartz crystal 104 and the ceramic substrate 112 are arranged and fabricated in a similar manner as described above with respect to FIG. 1. The quartz crystal 104 is attached to the pedestals 120, which may include a metallization structure as described above, using first and second bonding layers 204a, 204b.

In some embodiments, the quartz crystal 104 is configured for operation at a relatively high temperature, e.g., between about 150° C. and 350° C. or between about 200° C. and 300° C.

In the illustrated embodiment, the quartz crystal 104 has formed on a first major surface (facing up) a first electrode 106a. The first electrode 106a has a major portion formed on the first major surface as illustrated. In addition, while not illustrated, the first electrode 106a has a portion which extends from the major portion and wraps around the quartz crystal at the at the upper left corner region, to form an extension portion formed on a second major surface (facing down) and electrically contacting the first bonding layer 204a. The extension portion of the first electrode 106a, which is formed on the upper left corner, may have a similar shape as the illustrated portion of a second electrode 106b. Similar to the first major surface, the quartz crystal 104 has formed on the second major surface (facing down) a second electrode 106b. Similar to the first electrode 106a, the second electrode 106b has a major portion (not shown) formed on the second major surface and electrically contacting the second bonding layer 204b. In addition, as illustrated, the second electrode 106b has a portion which extends from the major portion and wraps around the quartz crystal at the at the bottom left corner region, to form the illustrated extension portion formed on the first major surface (facing up). The major portion of the second electrode 106b, which is formed on the second major surface, may have a similar shape as the illustrated major portion of the first electrode 106a.

In the illustrated embodiment, one end, e.g., at a shorter edge, of the quartz crystal 104 is attached electrically and mechanically to the pedestals 120 of the ceramic substrate 112 by the bonding layers 204a, 204b. Advantageously, by forming the bonding layers 204a, 204b on the one end, e.g., one shorter edge, the stress imparted by the bonding layers 204a, 204b on the crystal 104 can be reduced. In the illustrated embodiment, no other bonding layers may be formed. Such configuration may reduce the stress imparted on the crystal 104 compared to other configurations. However, other embodiments are possible. For example, the bonding layers may be formed at opposing shorter edges, opposing longer edges or at a longer edge. Additional bonding layers different from the illustrated bonding layers may also be present, as described in various embodiments below.

The inventors have surprisingly discovered that, when the bonding layers 204a, 204b are formed at the illustrated geometric locations using silver paste sintered in low-oxygen content ambience and thereafter packaged as described herein, the resulting quartz crystal 104 exhibits a relatively low positive drift in frequency over time, at least when the quartz crystal 104 is an AT cut quartz crystal. FIG. 3 illustrates a graph of experimental frequency drift measured from a packaged quartz crystal similar to the one described above with respect to FIGS. 2A-2C, according to embodiments. The experimental result was obtained by measuring a quartz crystal fabricated and packaged in a similar manner as described above, and measured after aging at 250° C. for various durations, and measured at room temperature (25° C.). The measured quartz crystal is an AT cut quartz crystal. As illustrated, the observed frequency drift, on average, remains relatively low (less than about 60 ppm) and in a positive direction after aging for longer than 2200 hours at 250° C. The result was surprising because, for all other packaged quartz crystals bonded using different bonding materials and/or methods, e.g., quartz crystals bonded using additional bonding layers, which may comprise flexible bonding materials, such as silver-containing epoxies, silicon-based elastomers and polyimide-based materials, none exhibited a positive shift in frequency drift, and most exhibited higher magnitudes of frequency drift in the negative direction. In the following, the combination of characteristics of the silver paste and the processing conditions that achieves such results is described.

According to various embodiments described herein, when the quartz crystal is bonded to the ceramic package substrate by one or more bonding layers formed of sintered silver paste, the resulting positive drift caused by the bonding layers is such that the positive drift in resonance frequency of the quartz crystal does not exceed 150 ppm, 125 ppm, 100 ppm, 75 ppm, 50 ppm, 25 ppm or an amount in a range defined by any of these values, after aging for 1000 hours, 2000 hours, 3000 hours, 4000 hours, 5000 hours, or a duration in a range defined by any of these values at 150° C., 175° C., 200° C., 225° C., 250° C. or a temperature in a range defined by any of these values. For instance, as illustrated in FIG. 3, the positive drift in resonance frequency of the quartz crystal does not exceed 100 ppm between 1000 hours and 3000 hours of aging at 250° C. The inventors have observed that the magnitude of frequency drift is directly proportional to the resonance frequency (or inversely proportional to the thickness) at least for AT crystals and directly proportional to the aging temperature. Other factors that may contribute to the magnitude of frequency drift may include package size, applied voltage, and temperature, among other factors. It will be appreciated that, without limitation, for some applications, it may be desirable to have the resonance frequency stabilize after a period of time.

The silver paste according to embodiments has various material attributes including the silver concentration, silver particle concentration and size distribution, thermal conductivity, modulus and thermal gravimetric analysis (TGA) behavior (e.g., glass transition temperature and weight loss behavior) such that subjecting the sliver paste to sintering conditions described herein results in a densifying diffusion that leads to the high quality sintered silver paste bonding layer described herein. In the following, densifying diffusional characteristics arising from the combination of various physical attributes of the silver paste and the sintering conditions is described, which in turn results in various advantages, including the observed frequency drift behavior of the quartz crystal and the mechanical, thermal and electrical integrity of the bonding layers.

Figure 4:
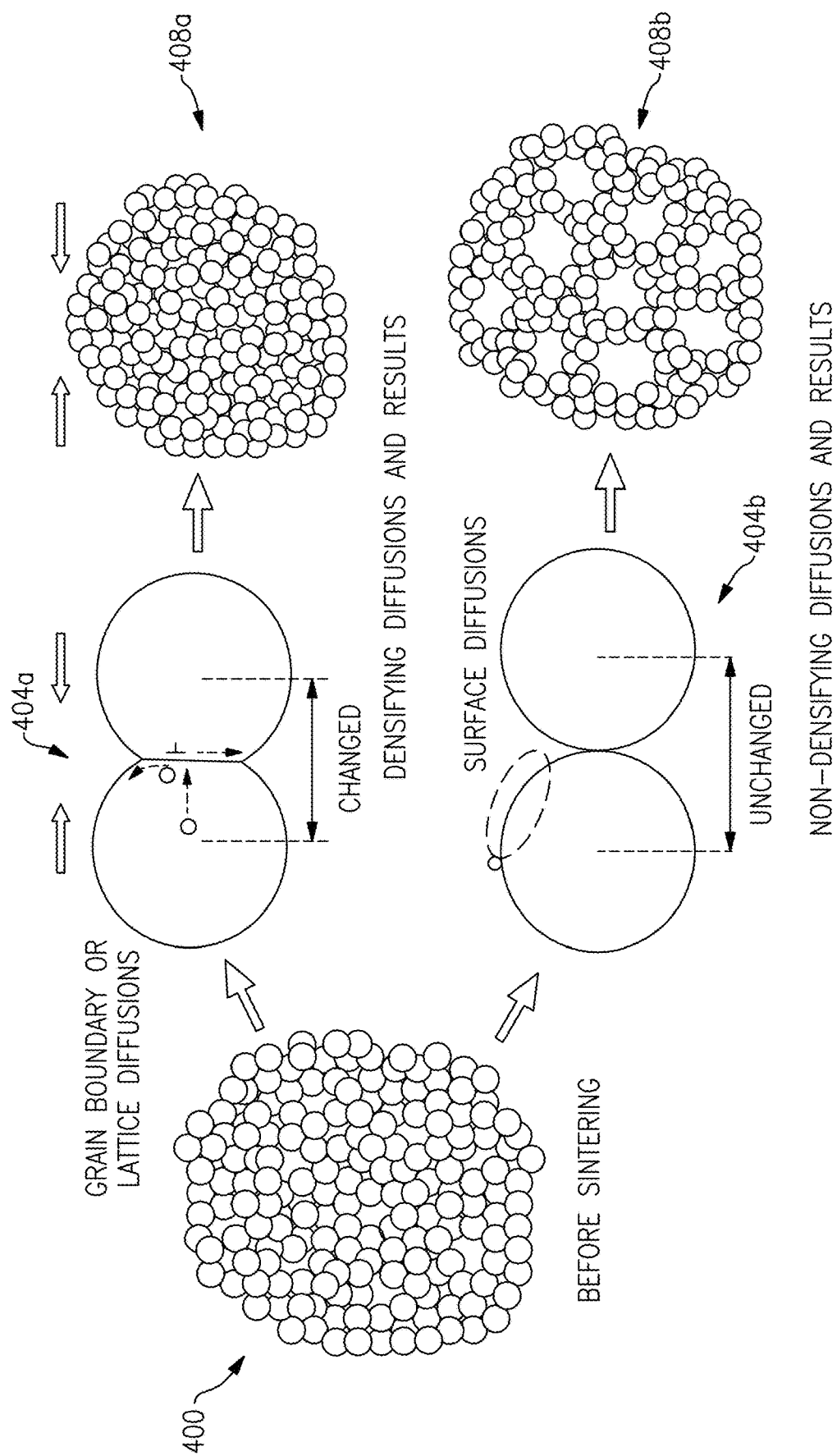
FIG. 4 schematically illustrates sintering behavior of silver particles in a silver paste according to embodiments, in comparison with conventional silver-containing epoxies or silver paste.

FIG. 4 qualitatively describes, without being bound to any theory, the sintering behavior of the silver paste according to embodiments, in comparison with some conventional bonding material, e.g., silver-containing epoxies, and/or sintering conditions. The inventors have realized that sufficient volume diffusion of silver atoms between silver particles during sintering, which transforms the silver paste into a percolated network of interconnected silver grains comprising greater than 90% by weight of silver, can be critical to achieving the various results described herein, including the various frequency drift behavior of the quartz crystal. It will be appreciated that, without sufficient volume diffusion of silver atoms, the particles may agglomerate or aggregate without sufficient fusing of the particles. When there is insufficient fusion of the particles, electrical and thermal conduction may occur through contacting surfaces, instead of through a network of fused particles. Notable distinguishing characteristics of the silver paste and sintering conditions according to embodiments are described herein.

First, compared to some conventional silver paste or epoxies, the composition and structure of the silver paste is such that, prior to substantial fusion of particles by atomic diffusion between the particles, the silver particles in the silver paste according to embodiments have relatively high mobility to rearrange to form a relatively close packed structure 408a, as illustrated in the upper right portion of FIG. 4. In addition, by having one or more size and shape distributions, the relatively close packed structure 408a can be achieved, which reduces the amount of volume in the resulting bonding layer that is unoccupied by the silver particles. In addition, the relatively close packed structure 408a can more effectively trap non-silver component of the paste, e.g., a resin, within the bonding layer. This in turn can lead to less stress relaxation during aging, and can trap relatively small amount of volatile material between particles, thereby producing the observed frequency drift, mechanical, thermal and electrical behavior in the bonding layer.

This is in contrast to some conventional silver paste or epoxies where, prior to substantial fusion of particles by atomic diffusion between the particles, the particles have relatively low mobility and as a result, the particles may form a relatively loosely packed structure 408b, as illustrated in the lower right portion of FIG. 4.

In addition, the silver paste according to embodiments described herein is configured to have relatively high densifying volume diffusion between the silver particles under the sintering conditions described herein, relative to low densifying surface diffusion between the silver particles. The inventors have realized that, among various sintering mechanisms, relatively high volume diffusion of silver atoms in the neck region between contacting silver particles can produce efficient densification with relatively higher amount of reduction of effective radii of the silver particles, to arrive at the percolated silver bonding layer having relatively high density. This is in contrast to some silver paste or epoxies, where non-densifying silver diffusion can be dominant at the sintering conditions. For example, as illustrated in the bottom center of FIG. 4, when the sintering process is dominated by surface diffusion, relatively smaller amount of reduction of effective radii of the silver particles is achieved, resulting in a silver bonding layer having relatively low density. In the following, various attributes of the silver paste that give rise to high density silver bonding layer according to embodiments are described.

The silver paste according to various embodiments has, prior to curing and/or sintering, silver particles having a mean particle size, e.g., measured along an axial direction having the longest dimension of each of the particles, that is in a range of about 0.10 µm to about 0.20 µm, about 0.20 µm to about 0.50 µm, about 0.50 µm to about 1.0 µm, about 1.0 µm to about 1.5 µm, about 1.5 µm to about 2.0 µm, about 2.0 µm to about 2.5 µm, about 2.5 µm to about 3.0 µm, about 3.0 µm to about 3.5 µm, about 3.5 µm to about 4.0 µm, about 4.0 µm to about 4.5 µm, about 4.5 µm to about 5.0 µm, about 5.0 µm to about 5.5 µm, about 5.5 µm to about 6.0 µm, or in a range defined by any of these values. In some embodiments, the silver particles have two or more size distributions having mean particle sizes within ranges defined by any of the above values. For example, the silver particles may have a first distribution having a first mean size in a range between about 0.10 µm and about 3.0 µm, and having a second distribution having a second mean size in a range between about 0.5 µm and about 6.0 µm.

According to various embodiments, prior to curing and/or sintering, the silver particles in the silver paste can have various shapes, including a sphere, a spheroid, an ellipsoid, a pyramid, a prism, a cube, a plate, a disc, and a rod, among other shapes. In some embodiments, the silver particles may have a first distribution having substantially a first shape, and a second distribution having substantially a second shape. For example, in some embodiments, the first distribution of silver particles having a first mean size in a range between any of the values described above, e.g., between about 0.10 µm and about 3.0 µm, may have a first shape, e.g., a plate shape, and the second distribution of silver particles having a second mean size in a range between any of the above values described above, e.g., between about 0.5 µm and about 6.0 µm, may have a second shape different from the first shape, e.g., an ellipsoid shape or a spheroid shape.

The silver paste has, according to various embodiments, prior to curing and/or sintering, silver content or silver particle content exceeding about 80 weight %, about 85 weight %, about 90 weight %, about 95 weight % or a value in a range defined by any of these values.

The silver paste has, according to various embodiments, prior to curing and/or sintering, a non-volatile portion, i.e., the portion that does not volatilize upon curing and/or sintering, that exceeds about 80 weight %, about 85 weight %, about 90 weight %, about 95 weight % or a value in a range defined by any of these values.

Silver pastes according to some embodiments does not have a glass transition temperature (Tg) or a relatively high glass transition temperature. For example, some silver pastes having silver content exceeding about 90 weight % after curing and/or sintering as described herein have been observed to not have a Tg. When the silver paste has a Tg, the Tg is higher than 160° C., higher than 180° C., higher than 200° C., higher than 220° C. or a temperature in a range defined by any of these values.

Still referring to FIG. 4, the high density silver bonding layer according to embodiments is achieved when annealed under various conditions described herein.

According to embodiments, after attaching a quartz crystal to a substrate, e.g., a ceramic package substrate using one or more silver paste layers, the intermediate structure is annealed under a substantially oxygen-free atmosphere. For example, the oxygen-free atmosphere contains molecular oxygen ($O_2$) at a concentration less than about 0.001% (1000 ppm), 0.0001% (100 ppm), 0.00001% (10 ppm), 0.000001% (1 ppm) or a value in a range defined by any of these values, according to embodiments. The inventors have discovered that the low oxygen level is critical for achieving the various characteristics of the bonding layers described herein, including the positive shift in frequency over time. Without being bound to any theory, the low oxygen content may reduce surface oxidation of silver particles, which enhances the coalescence and fusion of the silver particles for achieving high density, high strength, high thermal conductivity and high electrical conductivity.

According to some embodiments, the substantially oxygen-free atmosphere is a vacuum condition, e.g., a high vacuum having a total pressure less than about $1\times10^{-3}$ Torr, less than about $1\times10^{-4}$ Torr, less than about $1\times10^{-5}$ Torr, less than about $1\times10^{-6}$ Torr, less than about $1\times10^{-7}$ Torr, or a total pressure in a range defined by any of these values.

However, according to some other embodiments, the total pressure can be greater than 1×10⁻³ Torr, e.g., atmospheric pressure, where the annealing atmosphere is substantially an inert gas atmosphere comprising, e.g., $N_2$, He or Ar.

In yet some other embodiments, sintering can be performed in air.

According to embodiments, the silver paste is annealed under a pressureless condition; i.e., without applying a mechanical pressure to the quartz crystal and/or the ceramic package substrate.

According to embodiments, the silver paste is sintered at a temperature greater than about 200° C., about 225° C., about 250° C., about 275° C., about 300° C., about 325° C., about 350° C. or at a temperature in a range defined by any of these values.

According to some embodiments, prior to sintering, the silver paste can be optionally cured at a temperature lower than the sintering temperature, e.g., between about 150° C. and about 250° C., between about 175° C. and about 225° C., for instance at about 200° C., under an atmosphere described above. Without being bound to any theory, curing at a temperature below the sintering temperature can impart mobility to the silver particles prior to substantial fusion of the particles such that the silver particles increase their packing density, as described above with respect to FIG. 4. Subsequently, after achieving a relatively high packing density, upon sintering at a higher temperature, substantial volume diffusion of silver atoms occur to fuse the silver particles, as described above with respect to FIG. 4, thereby further increasing the density of the silver bonding layer.

In some embodiments, curing is performed in air, or in the presence of oxygen ($O_2$). The inventors have found that, when curing preceded by curing in oxygen or in air, higher densification can be obtained. Without being bound to any theory, when cured in the presence of oxygen, e.g., air, at the above-indicated temperatures, organic material in the silver paste may be burnt off, thereby leading to higher levels of densification during the subsequent vacuum sintering. This is illustrated with respect to FIGS. 11A-11C in comparison with FIGS. 12A-12C. However, embodiments are not so limited and curing may be performed in an inert atmosphere, e.g., $N_2$ atmosphere, at the above-indicated temperatures, prior to vacuum sintering.

Thus formed silver bonding layer has, after curing and/or sintering as described herein, silver content exceeding about 85 weight %, exceeding about 90 weight %, exceeding about 95 weight %, exceeding about 99 weight % or a value in a range defined by any of these values.

In part because of the high level of fusion of the silver particles and relatively small volume occupied by non-silver material, the annealed silver bonding layer has, according to various embodiments, a relatively high thermal conductivity, e.g., greater than 50 W/mK, greater than 100 W/mK, greater than 150 W/mK, greater than 200 W/mK, greater than about 225 W/mK, greater than 250 W/mK, or a value in a range defined by any of these values, for instance between about 200 W/mK and about 250 W/mK or between about 200 W/mK and about 225 W/mK. It will be appreciated that these values are substantially higher than those of additional bonding layers described herein, such as silver-containing epoxies, silicon-based elastomers and polyimide-based materials, which generally have thermal conductivities that are lower than about 20 W/mK, lower than about 10 W/mK, lower than about 5 W/mK, lower than about 2 W/mK or a value in a range defined by any of these values.

In addition, the annealed silver bonding layer has, according to various embodiments, a relatively high Young's modulus at room temperature, e.g., greater than 10 GPa, greater than 15 GPa, greater than 20 GPa, greater than 25 GPa, greater than 30 GPa, greater than 35 GPa or a value in a range defined by any of these values. It will be appreciated that these values are substantially higher than those of the additional or flexible bonding layers described herein, such as silver-containing epoxies, silicon-based elastomers and polyimide-based materials, which generally have Young's modulus that is lower than about 10 GPa, lower than about 5 GPa, lower than 2 GPa, lower than 1 GPa, or a value in a range defined by any of these values. For example, some silicon-based elastomers have Young's modulus between about 0.1 GPa and 0.5 GPa, and some epoxies have Young's modules between about 3 GPa and about 6 GPa.

The inventors have discovered that the various advantages of the silver bonding layers can also be partly attributed to the quality of bonding interface formed between the bonding layer and the contacting metal (e.g., electrodes on the quartz crystal and/or metallization structures on the ceramic package substrate). In particular, when the contacting metal comprises an element that forms a solid solution with silver, e.g., gold, the resulting interface can be substantially lower in thermal and electrical resistance and substantially high in bond strength.

In the following, various bonding arrangements for packaging quartz crystal according to embodiments are described, where the bonding layer comprising sintered silver paste advantageously causes in a relatively small positive shift in frequency of the quartz crystal over time, among other advantages, according to embodiments.

FIGS. 5A and 5B illustrate a plan-view 500A and a cross sectional view 500B, respectively, of a packaged quartz crystal 104, according to some embodiments. The packaged quartz crystal 104 is packaged in a similar manner as described above with respect to FIGS. 1 and 2A-2C. The surface of the quartz crystal 104, e.g., the surfaces of the electrodes 106a, 106b, is attached to the pedestals 120, which may include a metallization structure, using first and second bonding layers 204a, 204b. As described above, the first and second bonding layers 204a, 204b are formed by sintering silver paste in substantially oxygen free ambience at relatively high temperatures, e.g., temperatures above the operational temperature of the quartz crystal 104. In addition, one or both of the first and second bonding layers 204a, 204b may contact respective one or both of the first and the second electrodes 106a, 106b on one side, and contact a one or more metallization structure on the ceramic package having surface, e.g., a metallization surface comprising gold, on the other side.

However, unlike the packaged quartz crystal described above with respect to FIGS. 2A-2C, in which the quartz crystal is attached to the ceramic substrate 112 at two attachment locations on the same side of the crystal, the packaged quartz crystal 104 illustrated in FIGS. 5A and 5B is attached to the ceramic substrate 112 at an additional attachment location through an additional or a flexible bonding layer 504. Unlike the first and second bonding layers 204a, 204b, the flexible bonding layer 504 is not formed using the same silver paste used to form the first and second bonding layers 204a, 204b. Instead, the flexible bonding layer 504 is formed using a relatively flexible bonding material, e.g., an epoxy, silicon-based elastomer or polyimide-based bonding material, among other suitable flexible bonding material used for bonding electronic components. As described in the illustrated embodiment and throughout the specification, the flexible bonding layer 504 has Young's modulus that is less than about 10 GPa. In various embodiments, a ratio of Young's moduli of the first/second bonding layers 204a/204b and the flexible bonding layer 504 exceeds 2, 4, 6, 8, 10 or has a value in a range defined by any of these values. As described in the illustrated embodiment and throughout the specification, a ratio of thermal conductivities of the first/second bonding layers 204a/204b and the flexible bonding layer 504 exceeds 20, 40, 60, 80, 100 or a value in a range defined by any of these values. In some embodiments, the bonding layer 504 may also contain silver. However, when it contains silver, the flexible bonding layer 504 has a silver content that is substantially less than that of the silver paste used to form the first and second bonding layers 204a, 204b. For example, the flexible bonding layer 504 may contain less than 85%, less than 80% less than 75% by weight, or a percentage in a range defined by any of these values, prior to curing. Furthermore, the flexible bonding layer 504 has a composition such that it has a glass transition temperature (Tg) that is substantially less than the curing and/or sintering temperature used to form the first and second bonding layers 204, 204b. For example, the flexible bonding layer may have a Tg less than about 200° C., less than about 180° C., less than about 160° C., less than about 140° C., less than about 120° C. or a temperature in a range defined by any of these values. Example materials for the flexible bonding layer 504 includes Amicon® C990 series epoxy adhesive (Emmerson & Cumming Inc.), EPOXIOHM EO-98HT (EpoxySet Inc.) and EPO-TEK® P1011 (Epoxy Technology, Inc.), Sylgard® 170 (Dow Corning) and TB 3304 (ThreeBond International, Inc.), among others.

As described above with respect to FIG. 3, the inventors have discovered that, when the quartz crystal 104 is bonded to the ceramic substrate 112 using one or more bonding layers formed of an additional or a flexible bonding material without forming one or more bonding layers using a silver paste, the packaged quartz crystal 104 exhibits a negative drift in frequency over time under aging conditions. The inventors have further discovered that, as illustrated in FIGS. 5A and 5B, by bonding the quartz crystal 104 using one or more bonding layers (e.g., first and second bonding layers 204a, 204b) comprising sintered silver paste, which causes a positive drift in frequency over time under aging conditions, and using one or more flexible bonding layers (e.g., flexible bonding layer 504) using a flexible bonding, which causes a negative drift in frequency over time under aging conditions, the overall drift of the frequency under aging conditions can be reduced or even essentially eliminated by the compensating effect. Without being bound to any theory, the compensating effect may originate from compensating any of the physical origins of frequency drift described above. For example, the first and second bonding layers 204a, 204b formed of sintered silver paste may exert stress having a first sign (one of compressive or tensile) on the quartz crystal 104, while the flexible bonding layer 504 formed of a flexible bonding material may exert stress having a second sign opposite the first sign (the other of compressive or tensile) on the quartz crystal 104. In an alternative example, the first and second bonding layers 204a, 204b may introduce impurities of a first type in the quartz crystal 104 that shifts the resonance frequency in one direction, while the flexible bonding layer 504 may introduce impurities of a second type in the quartz crystal 104 that shifts the resonance frequency in the opposite direction.

The inventors have discovered a further advantage of bonding the quartz crystal using three or more bonding layers as illustrated in FIGS. 5A and 5B and other parts of the specification. The three or more bonding layers allows for the quartz crystal to be used in high-shock applications, e.g., high strength bonding bet such that the bonds do not fail, e.g., do not crack, in response to a shock pulse having a peak amplitude 5,000 g, 10,000 g, 20,000 g, 30,000 g. 40,000 g or a value in a range defined by any of these values, for a pulse width of 0.01 ms, 0.1 ms, 1 ms or a value in a range defined by any of these values.

FIGS. 6A and 6B illustrate a plan-view 600A and a cross sectional view 600B, respectively, of a quartz crystal 104, according to some embodiments. The quartz crystal 104 is packaged in a similar manner as the packaged quartz crystal described above with respect to FIGS. 5A and 5B, except, in addition to the first and second bonding layers 204a, 204b formed of sintered silver paste on a first side of the quartz crystal 104, the quartz crystal 104 is bonded on other side of the quartz crystal 104 using two additional or flexible bonding layers 604a and 604b formed at opposing corner regions as the first and second bonding layers 204a, 204b. Similar to the flexible bonding layer 504 described above with respect to FIGS. 5A and 5B, the flexible bonding layer 604a, 604b is formed using a relatively flexible bonding material, e.g., an epoxy, silicon-based elastomer, or a polyimide-based bonding material, among other comparable materials.

Figure 8C:
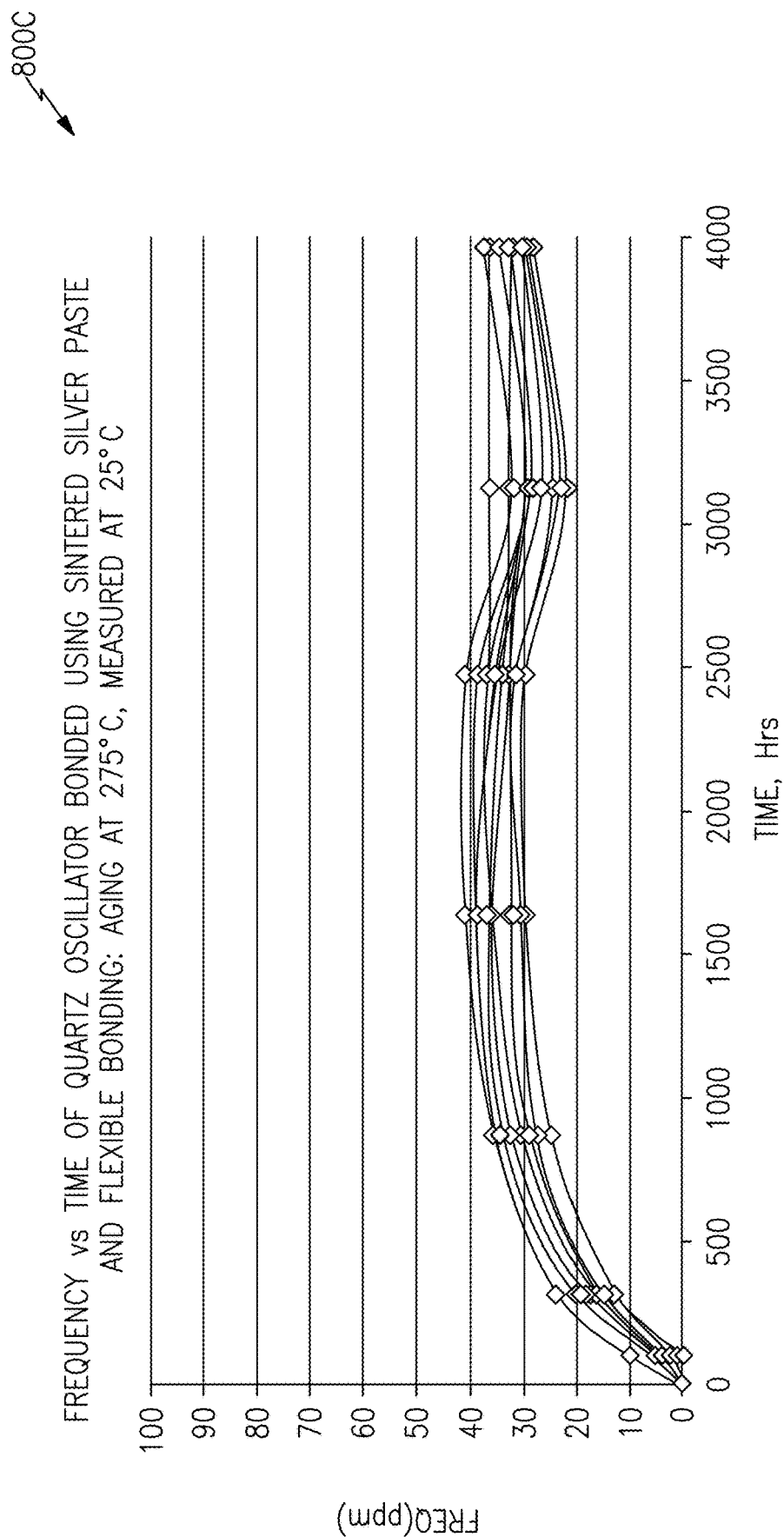
FIG. 8C illustrates an experimental graph of high temperature frequency drift of the quartz crystal oscillator packaged as illustrated in FIG. 8A, according to some embodiments.

According to embodiments described herein, when the quartz crystal is bonded to the ceramic substrate by one or more bonding layers formed of sintered silver paste layer and one or more bonding layers formed of an additional or a flexible material, the resulting positive drift and the negative drift caused by the different materials of the bonding layers, respectively, are such that a net drift in resonance frequency of the quartz crystal does not exceed +/−300 ppm, +/−250 ppm, +/−200 ppm, +/−150 ppm, +/−100 ppm, +/−50 ppm or an amount in a range defined by any of these values, after aging for 1000 hours, 2000 hours, 3000 hours, 4000 hours, 5000 hours, or a duration in a range defined by any of these values at 150° C., 175° C., 200° C., 225° C., 250° C. or a temperature in a range defined by any of these values. For instance, as illustrated in FIG. 8C, a net drift in resonance frequency of the quartz crystal does not exceed 50 ppm between 1000 hours and 5000 hours of aging at 275° C.

For some applications, a quartz crystal having one of various configurations as described may be electrically coupled to and packaged together in a common package substrate with an integrated circuit (IC) die, according to embodiments. As described herein, such configuration may be referred to as a quartz crystal oscillator.

FIGS. 7A and 7B illustrate a plan-view 700A and a cross sectional view 700B, respectively, of a packaged quartz oscillator comprising a crystal 104 and an integrated circuit (IC) 704 die, according to some embodiments. The quartz crystal 104 is packaged using a two-point bonding method similar to the packaged quartz crystal described above with respect to FIGS. 2A-2C. In some implementations, the integrated circuit 704 die comprising control circuitry for the quartz crystal 104 is adjacently bonded to the ceramic substrate 712 using a bonding layer 720 formed of sintered silver paste, e.g., the same silver paste as that used for forming the first and second bonding layers 204a, 204b. However, in other implementations, the bonding layer 720 can be formed of one of additional or flexible bonding materials described above, such that a relatively low net drift in resonance frequency can be obtained as described above Advantageously, the quartz crystal 104 and the integrated circuit die 704 can be processed simultaneously, including sintering under the substantially oxygen-free atmosphere, as described above. The IC die 704 is electrically connected to the outside world through wires 716 connected to metallization layers 708 formed on the ceramic substrate 712.

FIGS. 8A and 8B illustrate a plan-view 800A and a cross sectional view 800B, respectively, of a packaged quartz oscillator comprising a crystal 104 and an integrated circuit (IC) 704 die, according to some embodiments. The quartz crystal 104 is packaged using a three-point bonding method as the quartz crystal described above with respect to FIGS. 5A and 5B, including the first and second bonding layers 204a, 204b formed of sintered silver paste, and the additional or flexible bonding layer 504 formed of a flexible bonding material. Other embodiments are possible. For example, the quartz crystal 104 can be packaged using a four-point bonding method as described above with respect to FIGS. 6A and 6B. In addition, in a similar manner as described above with respect to FIGS. 7A and 7B, the IC 704 die comprising control circuitry for the quartz crystal 104 is adjacently bonded to the ceramic substrate 712 using a bonding layer 720 formed of sintered silver paste.

FIG. 8C illustrates a graph 800C of experimental frequency drift measured on a quartz crystal 104 packaged in a similar manner as illustrated in FIGS. 8A and 8B. In the illustrated embodiment, the quartz crystal blank was configured to have a resonance frequency of 16.8 MHz, and the as-fabricated quartz crystal oscillator was configured to have a resonance frequency of 32.8 kHz. The quartz crystal 104 was bonded using bonding layers 204a, 204b formed of sintered silver paste and an additional or flexible bonding layer 504 formed of TB 3304 described above as the flexible bonding materials. The experimental result was obtained by measuring quartz crystal oscillator fabricated in a similar manner as described above, and measured after aging at 275° C. for various durations, and measured at room temperature (25° C.). As described above, the inventors have observed a compensating effect between the bonding layers 204a, 204b and the flexible bonding layer 504, such that a positive net drift in frequency of relatively low magnitude (less than about 40 ppm) was observed after greater than 4000 hours of aging.

Figure 8D:
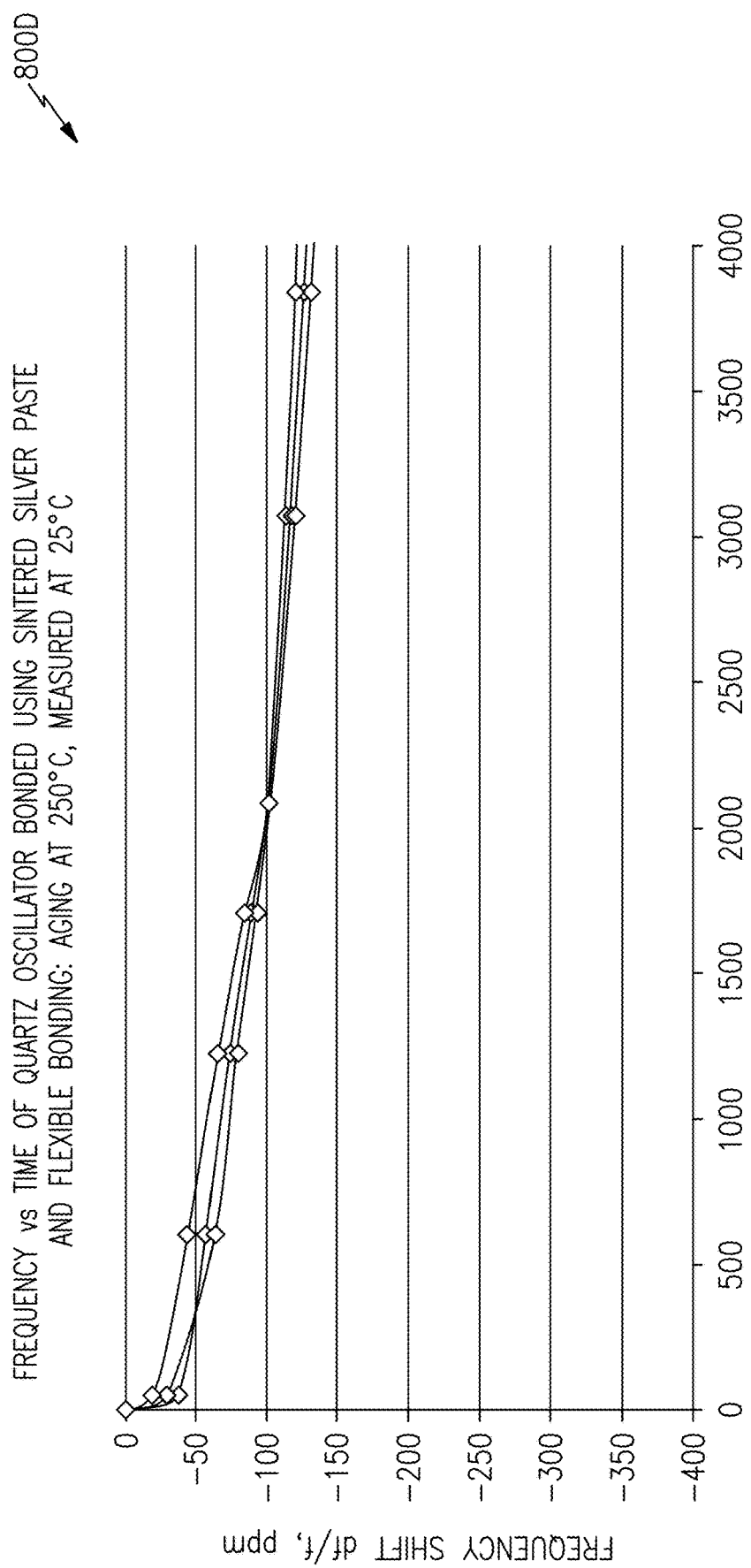
FIG. 8D illustrates an experimental graph of high temperature frequency drift of the quartz crystal oscillator packaged as illustrated in FIG. 8A, according to some embodiments.

FIG. 8D illustrates a graph 800D of experimental frequency drift results measured on a quartz crystal 104 packaged in a similar manner as illustrated in FIGS. 8A and 8B. In the illustrated embodiment, the quartz crystal blank was configured to have a resonance frequency of 24 MHz, and the as-fabricated quartz crystal oscillator was configured to have a resonance frequency of 6 MHz. The quartz crystal 104 was bonded using bonding layers 204a, 204b formed of sintered silver paste and an additional or flexible bonding layer 504 formed of Sylgard® 170 described above as the flexible material, which is different from that used in the tested quartz crystal illustrated in FIG. 8C. The experimental result was obtained by measuring quartz crystal oscillator fabricated in a similar manner as described above, and measured after aging at 250° C. for various durations, and measured at room temperature (25° C.). As described above, the inventors have observed a compensating effect between the bonding layers 204a, 204b and the flexible bonding layer 504, such that a negative net drift in frequency of relatively low magnitude (less than about 150 ppm) was observed after greater than 4000 hours of aging.

Figure 8E:
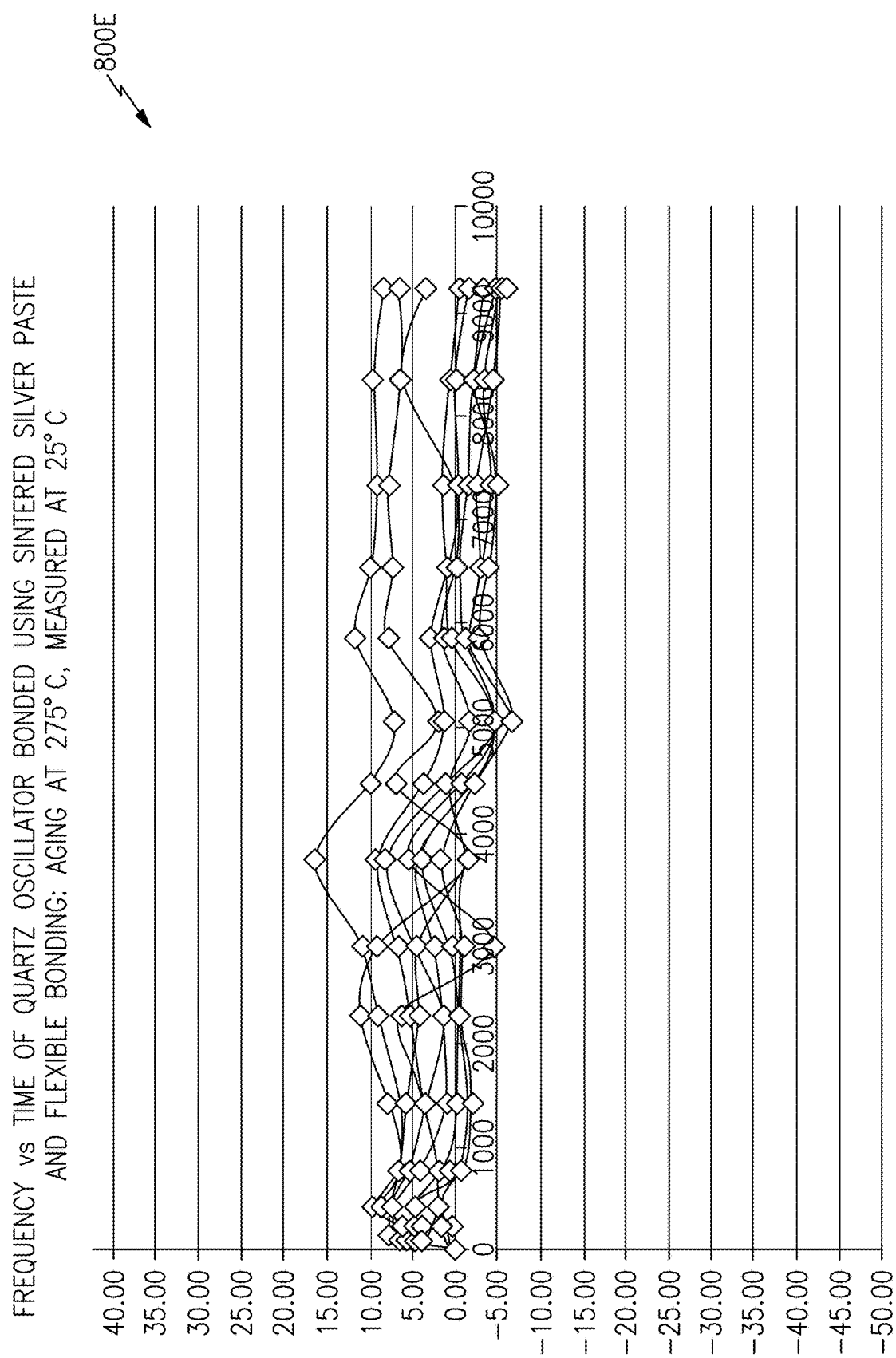
FIG. 8E illustrates an experimental graph of high temperature frequency drift of the quartz crystal oscillator packaged as illustrated in FIG. 8A, according to some embodiments.

FIG. 8E illustrates a graph 800E of experimental frequency drift results measured on a quartz crystal 104 packaged in a similar manner as illustrated in FIGS. 8A and 8B. In the illustrated embodiment, the quartz crystal blank was configured to have a resonance frequency of 24 MHz, and the as-fabricated quartz crystal oscillator was configured to have a resonance frequency of 12 MHz. The quartz crystal 104 was bonded using bonding layers 204a, 204b formed of sintered silver paste and an additional or flexible bonding layer 504 formed of TB 3304 described above as the flexible bonding materials, which is similar to that used in the tested quartz crystal illustrated in FIG. 8C. The experimental result was obtained by measuring quartz crystal oscillator fabricated in a similar manner as described above, and measured after aging at 250° C. for various durations, and measured at room temperature (25° C.). As described above, the inventors have observed a compensating effect between the bonding layers 204a, 204b and the flexible bonding layer 504, such that a negative net drift in frequency of relatively low magnitude (less than about 10 ppm) was observed after greater than 9000 hours of aging.

FIGS. 9A and 9B illustrate a plan-view 900A and a cross sectional view 900B, respectively, of a packaged quartz oscillator comprising a crystal 104 and an integrated circuit (IC) 704 die, according to some embodiments. The quartz crystal 104 is packaged in a similar manner as the quartz crystal described above with respect to FIGS. 7A and 7B. However, unlike the quartz oscillator illustrated above with respect to FIGS. 7A and 7B, the integrated circuit 704 die comprising control circuitry for the quartz crystal 104 is disposed in a cavity formed below the quartz crystal 104 and bonded using sintered silver paste. The illustrated configuration allows for a more compact package, among other advantages. Similar to the packaged quarts oscillator described above with respect to FIGS. 7A and 7B, the quartz crystal 104 and the integrated circuit die 704 can be processed simultaneously, including sintering under the substantially oxygen-free atmosphere, as described above.

Figure 10A:
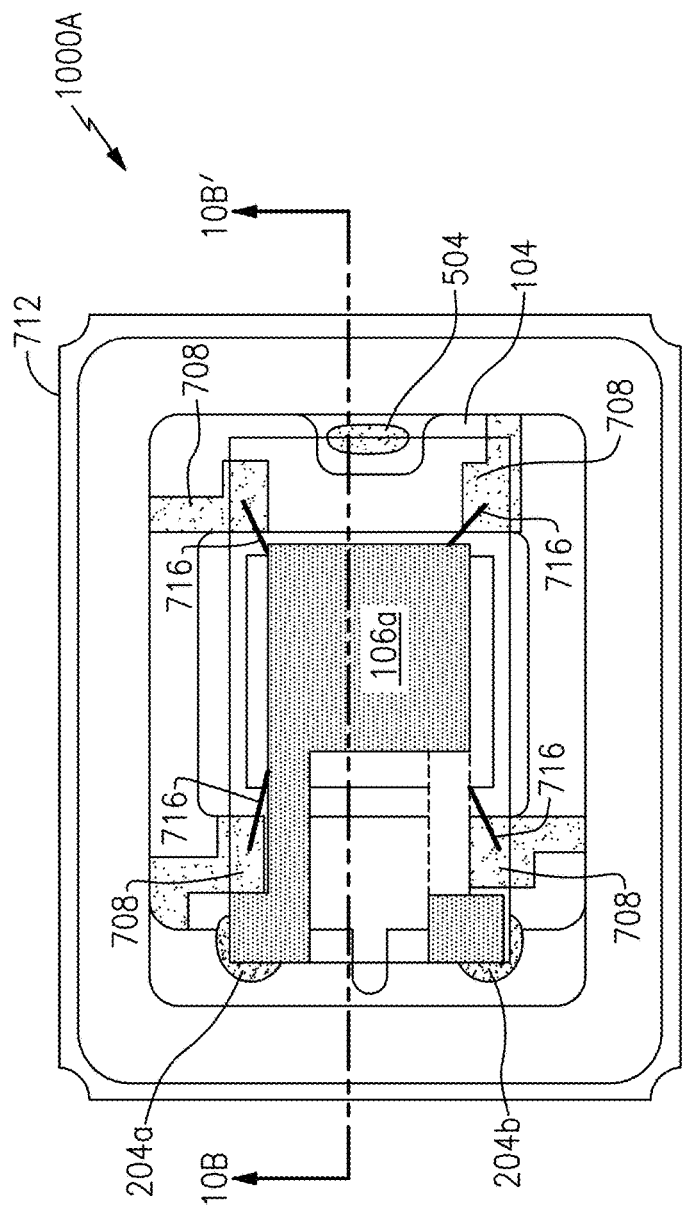
FIG. 10A illustrates a plan-view of a quartz crystal and an integrated circuit die packaged in a ceramic package substrate, according to some embodiments.
Figure 10B:
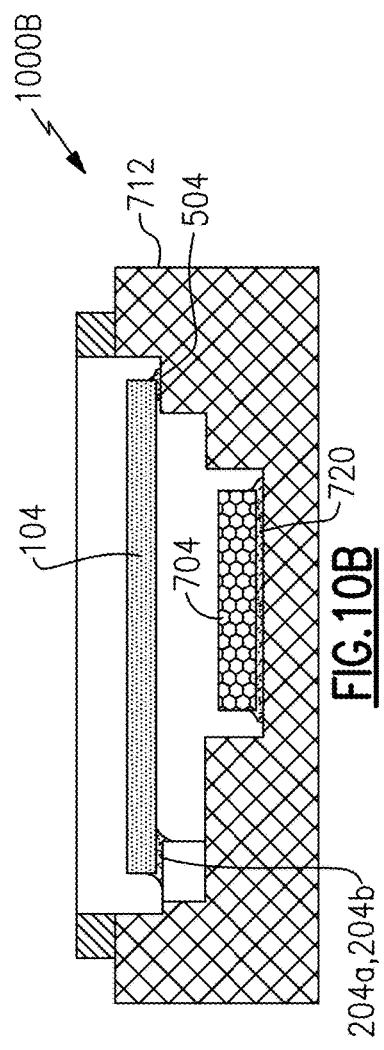
FIG. 10B illustrates a cross-sectional view of the packaged quartz crystal and the integrated circuit die illustrated in FIG. 10A.

FIGS. 10A and 10B illustrate a plan-view 1000A and a cross sectional view 1000B, respectively, of a packaged quartz oscillator comprising a crystal 104 and an integrated circuit (IC) 704 die, according to some embodiments. The quartz crystal 104 and the IC die 704 are packaged in a similar manner as the quartz crystal described above with respect to FIGS. 8A and 8B, including the first and second bonding layers 204a, 204b formed of sintered silver paste, and the additional or flexible bonding layer 504 formed of a flexible bonding material. In addition, similar to the packaged quartz oscillator described above with respect to FIGS. 9A and 9B, the quartz crystal 104 is bonded in a cavity formed below the quartz crystal 104 using sintered silver paste.

Figure 11A:
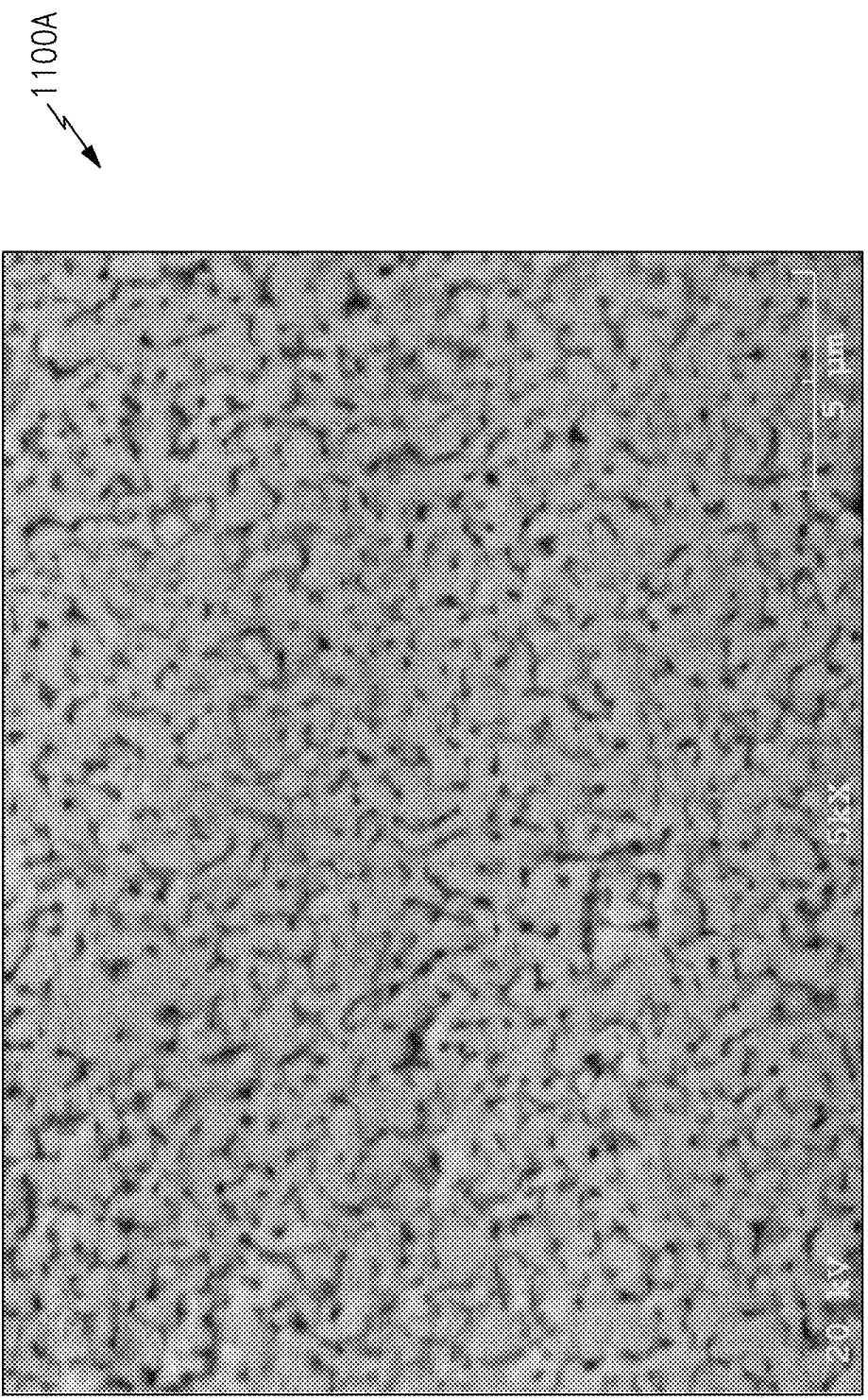
FIG. 11A is a cross-sectional scanning electron micrograph (SEM) of a sintered silver bonding layer, after curing in air.
Figure 11B:
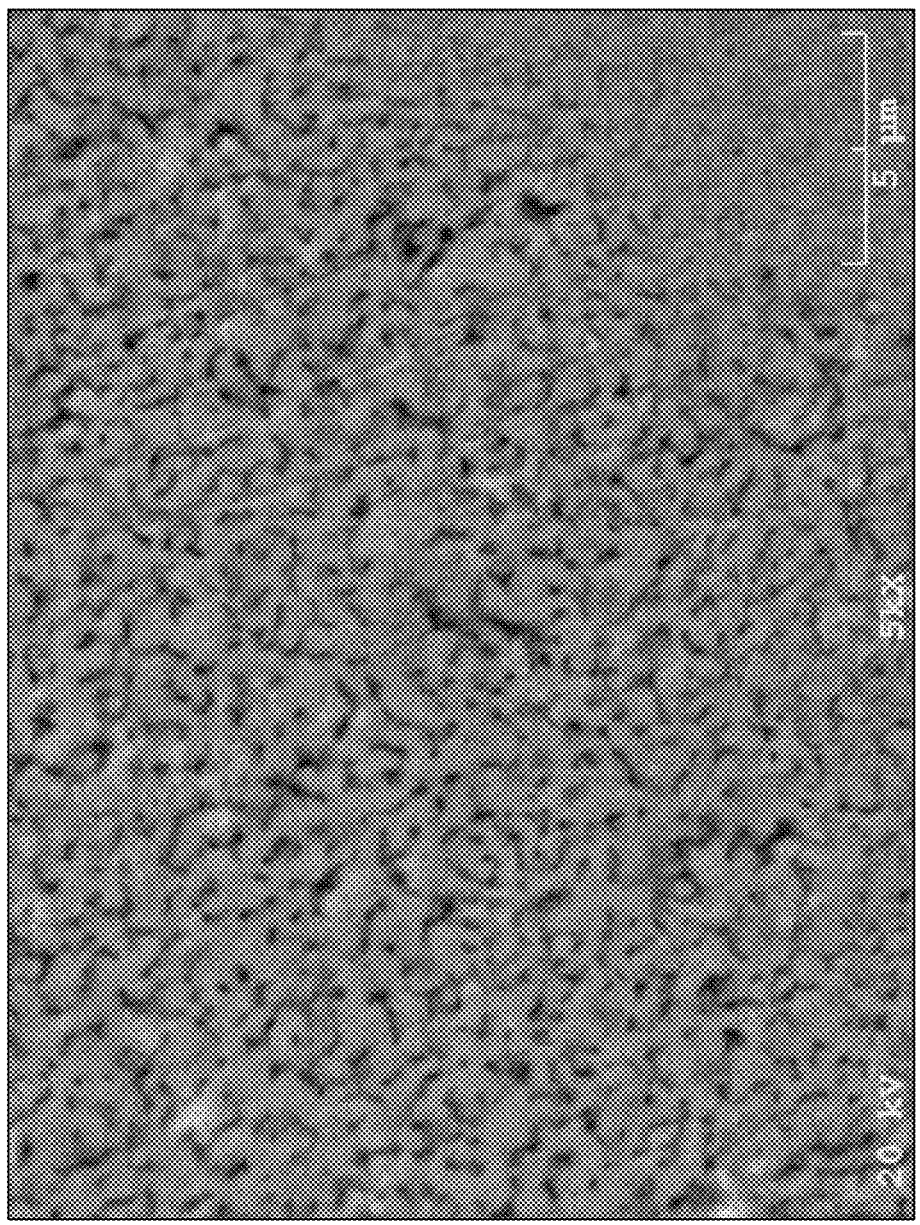
FIG. 11B is a cross-sectional scanning electron micrograph (SEM) of a sintered silver bonding layer, after curing in air and sintering under vacuum.
Figure 11C:
FIG. 11C is a cross-sectional scanning electron micrograph (SEM) of a sintered silver bonding layer, after curing in air and sintering under vacuum.

FIG. 11A is a cross-sectional scanning electron microscopy (SEM) image of a sintered silver bonding layer, after curing in air at 185° C. for 90 minutes in air. FIG. 11B is an SEM image of a sintered silver bonding layer, after curing in air at 185° C. for 90 minutes in air, followed by sintering in vacuum at 275° C. for 8 hours. FIG. 11C is an SEM image of a sintered silver bonding layer, after curing in air at 185° C. for 90 minutes in air, followed by sintering in vacuum at 275° C. for 16 hours.

Figure 12A:
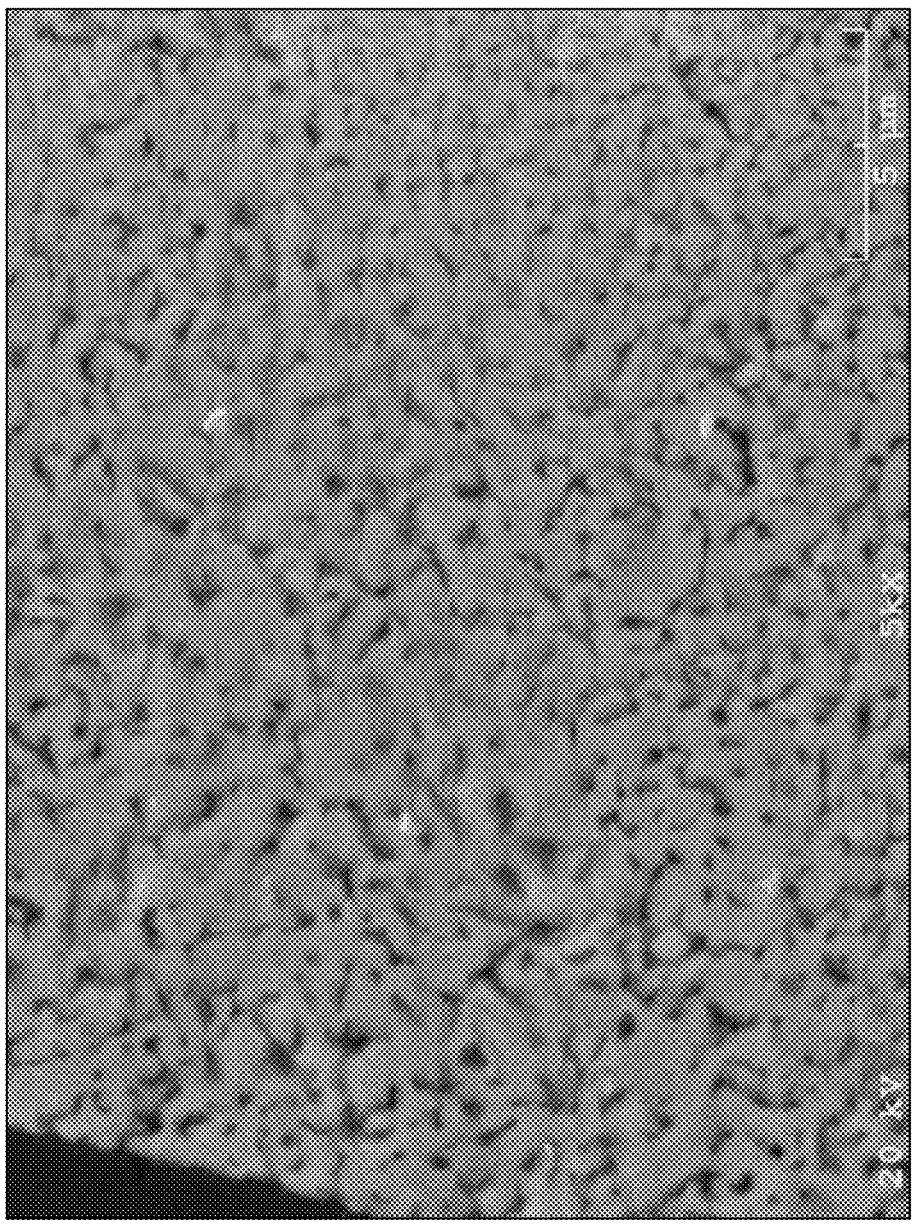
FIG. 12A is a cross-sectional scanning electron micrograph (SEM) of a sintered silver bonding layer, after curing in nitrogen.
Figure 12B:
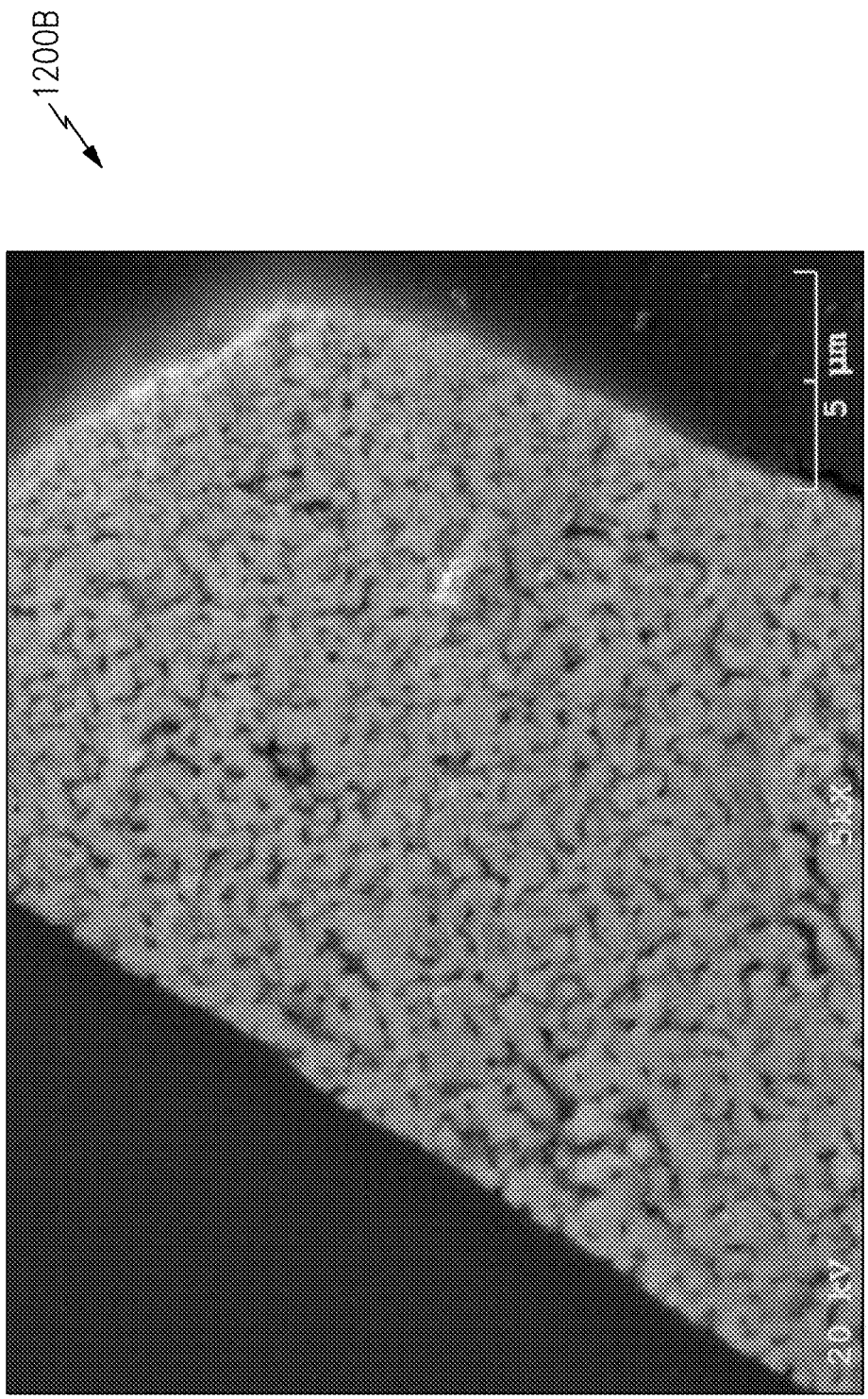
FIG. 12B is a cross-sectional scanning electron micrograph (SEM) of a sintered silver bonding layer, after curing in nitrogen and sintering under vacuum.
Figure 12C:
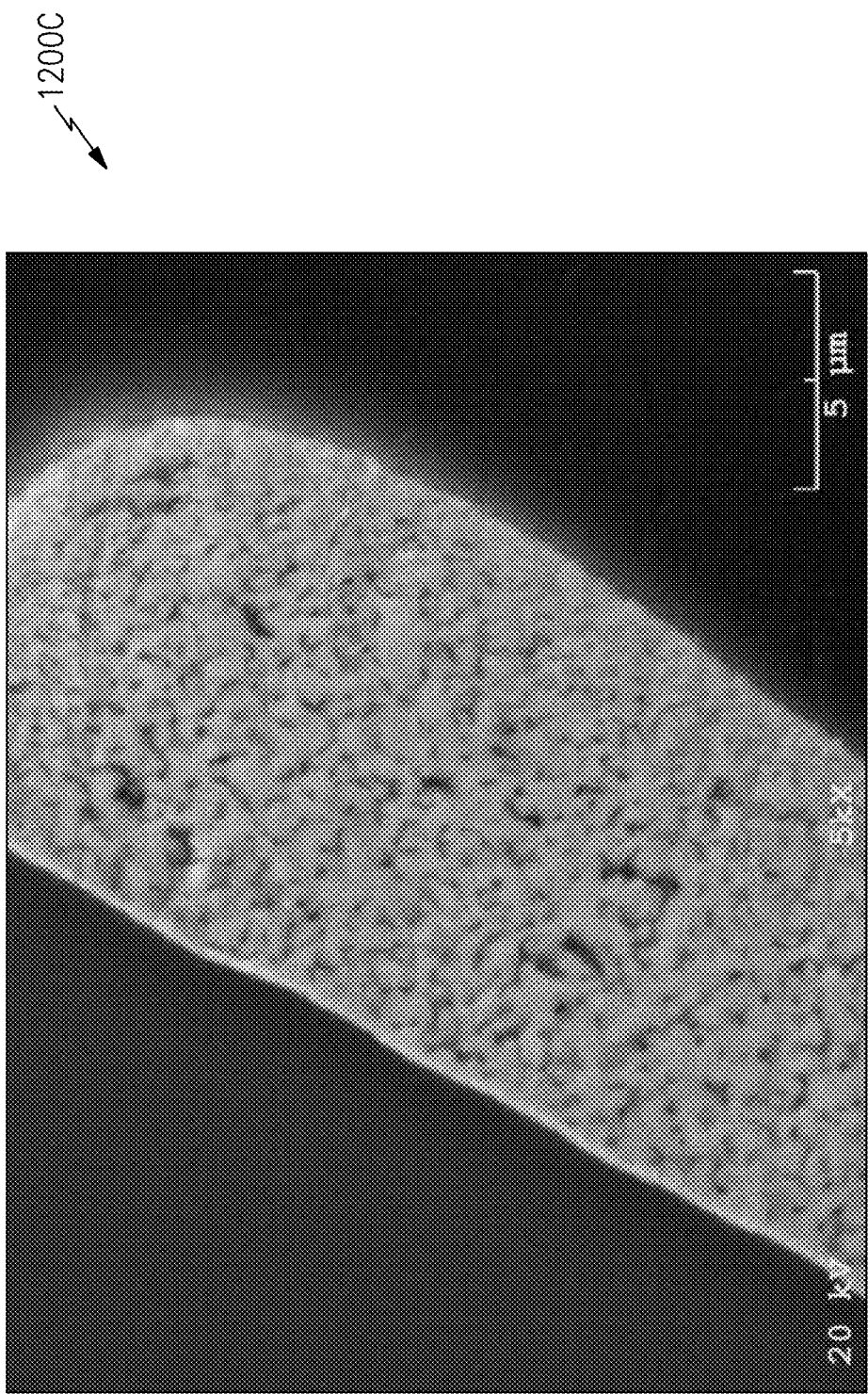
FIG. 12C is a cross-sectional scanning electron micrograph (SEM) of a sintered silver bonding layer, after curing in nitrogen and sintering under vacuum.

FIG. 12A is a cross-sectional scanning electron microscopy (SEM) image of a sintered silver bonding layer, after curing in air at 200° C. for 90 minutes in nitrogen. FIG. 12B is an SEM image of a sintered silver bonding layer, after curing in air at 200° C. for 90 minutes in nitrogen, followed by sintering in vacuum at 275° C. for 8 hours. FIG. 12C is an SEM image of a sintered silver bonding layer, after curing in air at 200° C. for 90 minutes in nitrogen, followed by sintering in vacuum at 275° C. for 16 hours.

As described above, higher levels of densification has been observed when vacuum sintering, or substantially oxygen-free sintering at a sintering temperature, is preceded by curing in an oxygen containing environment at a curing temperature lower than the sintering temperature.

Aspects of this disclosure can be implemented in various electronic devices. In particular, applications of the electronic devices include, but are not limited to, high temperature, high reliability and/or high shock and vibration environments, such as oil/gas exploration, geophysical services, avionics, aerospace, military, process control and other harsh industrial applications. However, applications are not so limited and examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products. Aspects of this disclosure can be particularly implemented in various wireless telecommunication technologies in which high power, high frequency bands, improved linearity and/or improved efficiency are desired, including military and space applications such as radars, community antenna television (CATV), radar jammers and wireless telecommunication base-stations, to name a few.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of packaging a quartz crystal, the method comprising:
    forming a sintered silver paste bonding layer to bond a quartz crystal to a package substrate at a first location, thereby causing a resonance frequency of the quartz crystal to shift in a first frequency direction; and
    forming an additional bonding layer to further bond the quartz crystal to the package substrate at a second location, thereby causing the resonance frequency of the quartz crystal to shift in a second frequency direction opposite the first frequency direction, the additional bonding layer having a different silver content relative to a silver content of the sintered silver paste bonding layer and comprising one or more of an epoxy, a silicon-based elastomer and a polyimide-based material.

2. The method of claim 1, wherein the sintered silver paste bonding layer causes the resonance frequency of the quartz crystal to increase, whereas the additional bonding layer causes the resonance frequency of the quartz crystal to decrease.

3. The method of claim 2, wherein the sintered silver paste bonding layer and the additional bonding layer are formed on opposite edge regions of the quartz crystal that are separated in a lengthwise direction of the quartz crystal.

4. The method of claim 2, further comprising attaching an integrated circuit (IC) die electrically connected to the quartz crystal and to the package substrate by sintering an additional silver paste layer comprising silver particles.

5. The method of claim 4, wherein the IC die is disposed laterally adjacent to the quartz crystal.

6. The method of claim 4, wherein the IC die is disposed in a cavity formed in the package substrate under the quartz crystal.

7. The method of claim 1, wherein forming the sintered silver paste bonding layer comprises sintering a silver paste comprising silver particles at a concentration exceeding 85 weight %.

8. The method of claim 7, wherein sintering the silver paste transforms the silver paste into the sintered silver paste bonding layer comprising greater than 90% by weight of silver.

9. The method of claim 1, wherein forming the sintered silver paste bonding layer comprises sintering a silver paste in a substantially oxygen-free atmosphere containing molecular oxygen at a concentration less than about 0.001%.

10. The method of claim 9, further comprising, prior to sintering, curing the silver paste at a curing temperature lower than a sintering temperature and between about 150° C. and about 250° C. in air.

11. The method of claim 9, wherein forming the sintered silver paste bonding layer comprises sintering the silver paste at a sintering temperature between about 225° C. and about 325° C.

12. The method of claim 7, wherein the silver particles comprise a mean particle size between about 0.1 μm and 3.0 μm.

13. The method of claim 7, wherein the silver particles comprise a shape distribution selected from the group consisting of a sphere, a spheroid, an ellipsoid, a pyramid, a prism, a cube, a plate, a disc, and a rod.

14. The method of claim 9, wherein the substantially oxygen-free atmosphere is a high vacuum atmosphere having a total pressure of about $1\times10^{-7}$ Torr to $1\times10^{-3}$ Torr.

15. The method of claim 1, wherein the additional bonding layer has a glass transition temperature less than 200° C.

16. The method of claim 1, wherein the shift of the resonance frequency in the first frequency direction comprises a positive drift in the resonance frequency of the quartz crystal and the shift of the resonance frequency in the second frequency direction comprises a negative drift in the resonance frequency of the quartz crystal.

17. The method of claim 16, wherein the positive drift and the negative drift are such that a net drift in the resonance frequency of the quartz crystal does not exceed +/−200 ppm.

18. The method of claim 1, wherein the additional bonding layer has a lower silver content relative to the silver content of the sintered silver paste bonding layer.

19. The method of claim 18, wherein a ratio of thermal conductivities of the sintered silver paste bonding layer and the additional bonding layer exceeds 20.

20. The method of claim 18, wherein a ratio of Young's moduli of the sintered silver paste bonding layer and the additional bonding layer exceeds 2.

* * * * *